(12) United States Patent
Sato

(10) Patent No.: US 7,005,712 B2
(45) Date of Patent: Feb. 28, 2006

(54) METHOD FOR MANUFACTURING A SEMICONDUCTOR DEVICE

(75) Inventor: Tetsumasa Sato, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/759,609

(22) Filed: Jan. 16, 2004

(65) Prior Publication Data

US 2004/0232453 A1 Nov. 25, 2004

(30) Foreign Application Priority Data

Jan. 17, 2003 (JP) .............................. 2003-009932

(51) Int. Cl.
*H01L 29/94* (2006.01)
*H01L 31/062* (2006.01)

(52) U.S. Cl. ...................... 257/379; 257/380; 257/647; 438/200

(58) Field of Classification Search ................ 257/379, 257/380, 647
See application file for complete search history.

(56) References Cited

U.S. PATENT DOCUMENTS

| | | | | |
|---|---|---|---|---|
| 4,233,615 A | * | 11/1980 | Takemoto et al. | 257/273 |
| 4,698,530 A | * | 10/1987 | Thomson | 327/410 |
| 4,898,837 A | * | 2/1990 | Takeda et al. | 438/332 |
| 5,377,140 A | * | 12/1994 | Usuki | 365/154 |
| 5,798,295 A | * | 8/1998 | Hoover et al. | 438/533 |
| 5,888,875 A | * | 3/1999 | Lasky | 438/383 |

FOREIGN PATENT DOCUMENTS

| | | | |
|---|---|---|---|
| EP | 545363 A1 | * | 9/1993 |
| JP | 1-133343 | | 5/1989 |
| JP | 11-121631 | | 4/1999 |
| JP | 2001-313388 | | 9/2001 |
| JP | 2002-134630 | | 10/2002 |

OTHER PUBLICATIONS

Japanese language Examination Result issued in corresponding Application No. JP-2003-009932.

* cited by examiner

*Primary Examiner*—Tu-Tu Ho
(74) *Attorney, Agent, or Firm*—John J. Penny, Jr.; Edwards Angell Palmer & Dodge LLP

(57) ABSTRACT

A semiconductor device of the present invention includes a semiconductor layer 10, an insulation gate type heavy insulated transistor 200 and an insulation gate type light insulated transistor 300 having different drain-source breakdown voltages and formed on the semiconductor layer 10, and a resistive impurity layer 24 formed on the semiconductor layer 10.

1 Claim, 29 Drawing Sheets

METHOD FOR MANUFACTURING A SEMICONDUCTOR DEVICE

FIELD OF THE INVENTION

The present invention relates to a semiconductor device including a resistive impurity layer, and a manufacturing method of the same.

BACKGROUND

As for a resistive element formed on a semiconductor layer, a resistive impurity layer is exemplified. The resistive impurity layer is formed, for example, by doping an impurity to the semiconductor layer made from silicon substrate. The resistive impurity layer is formed, for example, in a region (active region), electrically isolated by an element isolation region. In this case, for a normal operation of the resistive impurity layer, it is important to ensure insulation between the resistive impurity layer and its peripheral region sufficiently by using the element isolation region.

SUMMARY

The object of the present invention is to provide a new semiconductor device including a resistive impurity layer and a manufacturing method of the same.

A manufacturing method of a semiconductor device, comprising: (a) forming an element isolation region and an active region, electrically isolated by the element isolation region, on a semiconductor layer; and (b) forming a resistive impurity layer, at least, in a part of the active region by forming a first impurity-doping region, and providing a first impurity-doping forbidden region in the element isolation region at the same time.

DETAILED DESCRIPTION OF THE EMBODIMENTS

Hereinafter, preferred embodiments of the present invention will be explained by referring to the accompanying drawings.

Figure 1:
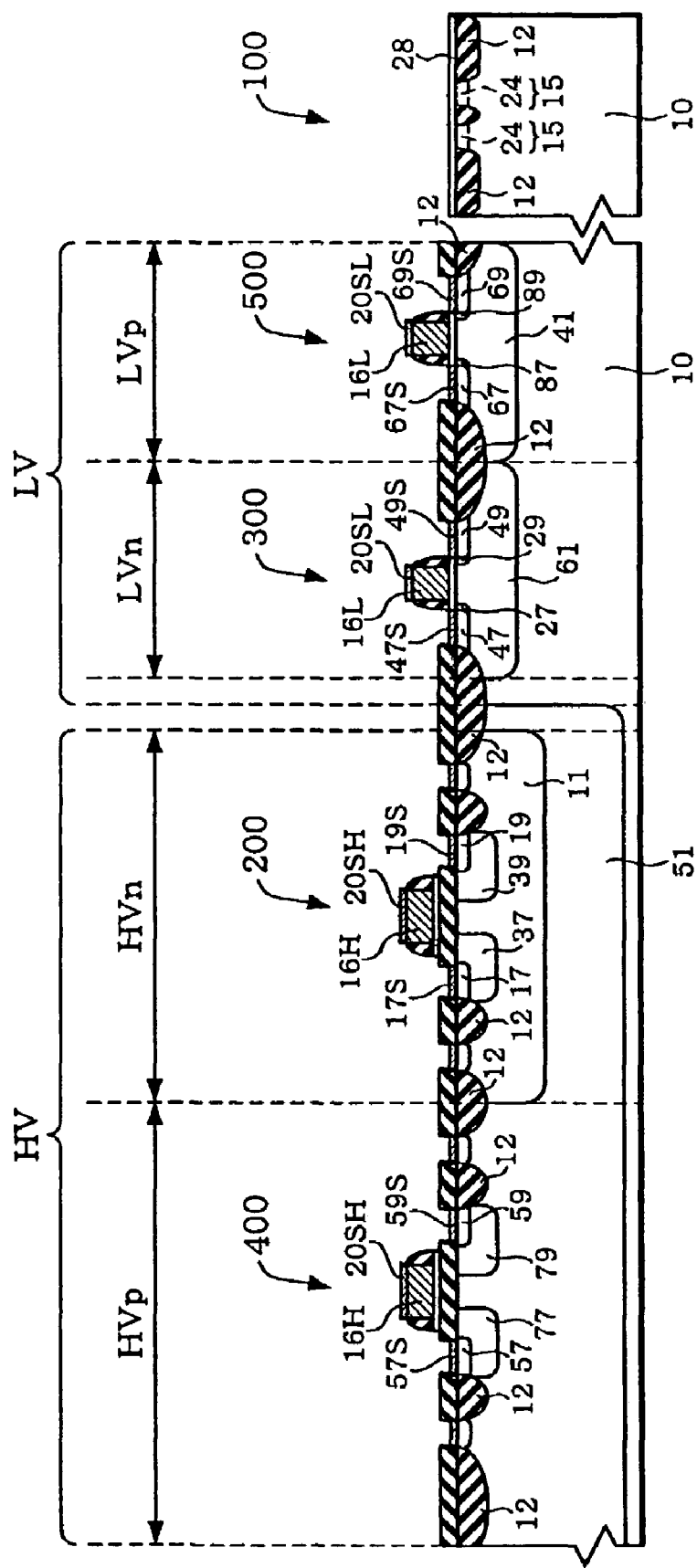
FIG. 1 shows a schematic sectional view of a semiconductor device according to an embodiment of the present invention.
Figure 2:
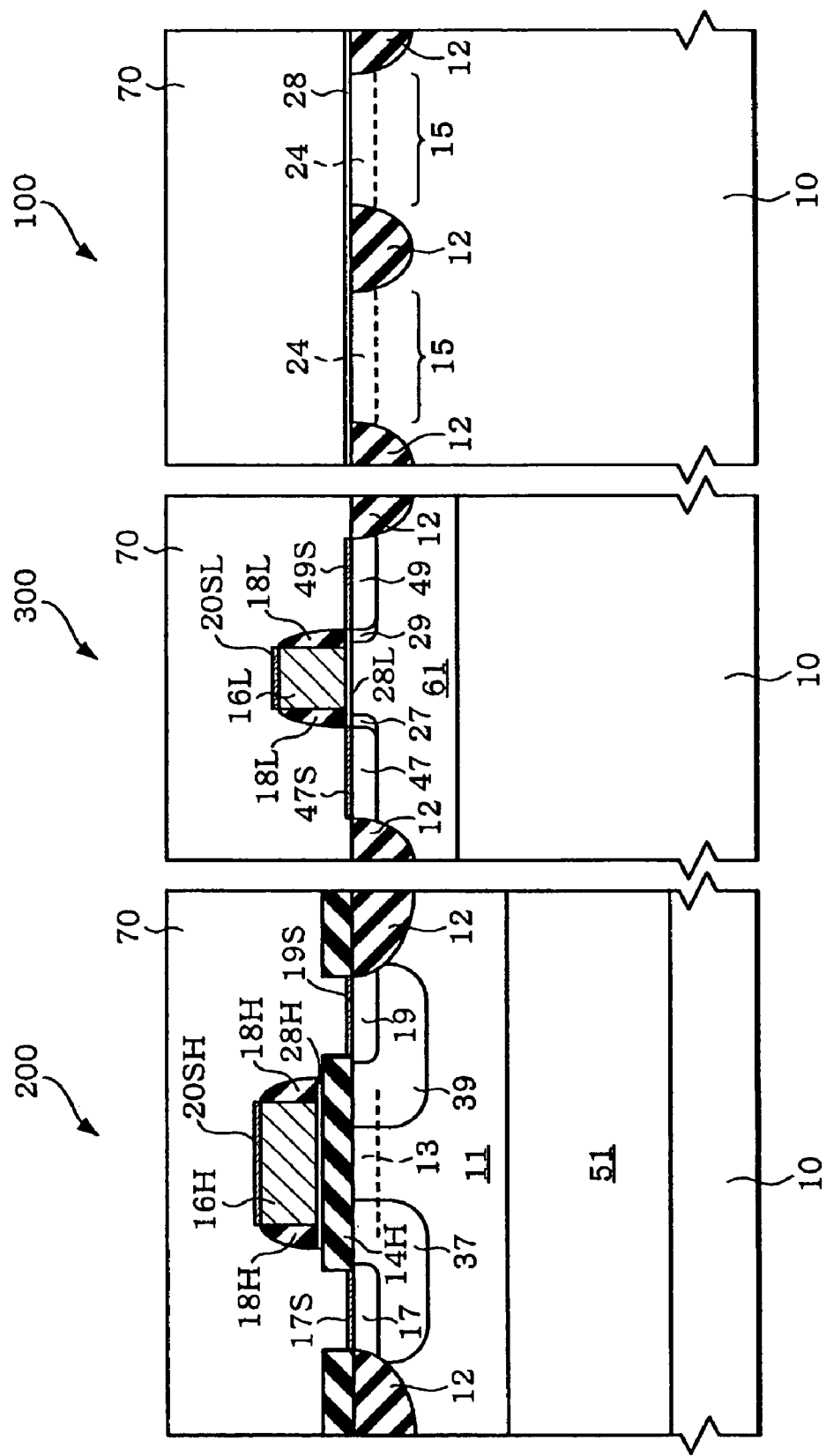
FIG. 2 shows schematic sectional views of a heavy insulated transistor, a light insulated transistor and a resistive element in the semiconductor device shown in FIG. 1.
Figure 3:
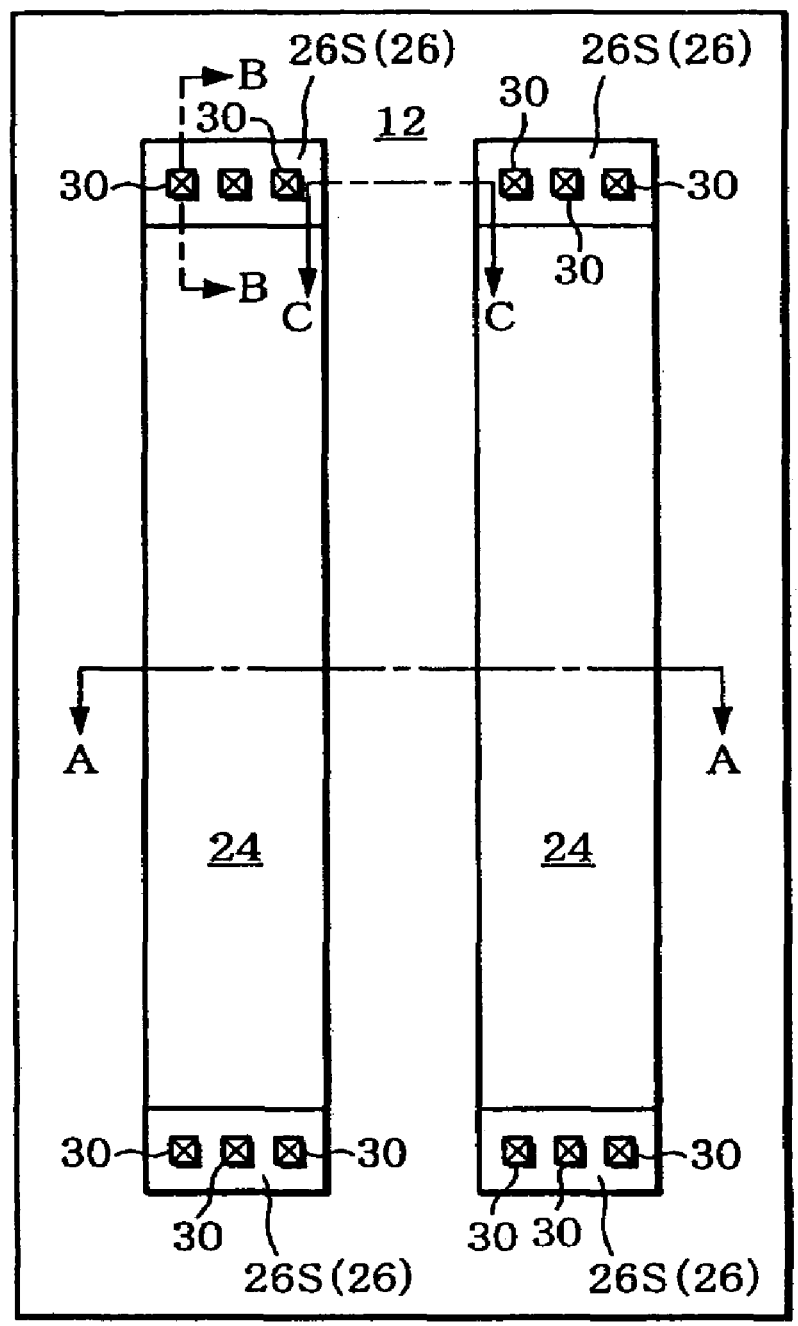
FIG. 3 shows a schematic plan view of the resistive element shown in FIGS. 1 and 2.
Figure 4:
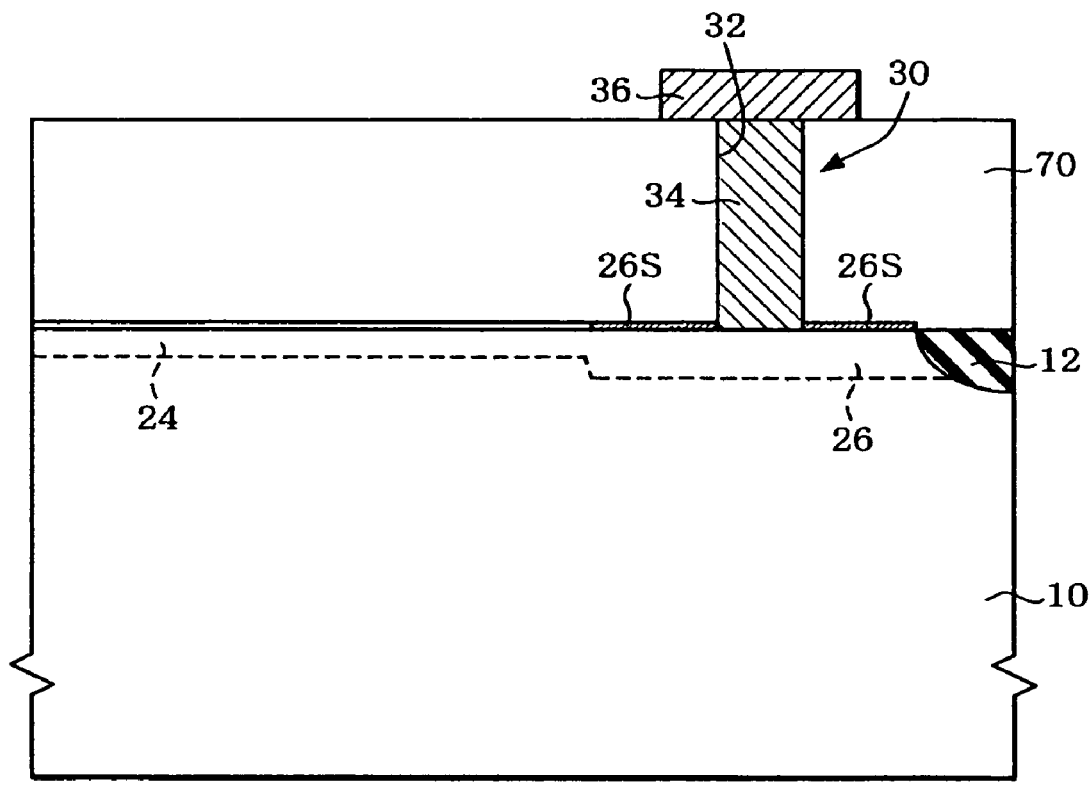
FIG. 4 shows a schematic sectional view of the resistive element along the line B—B shown in FIG. 3.
Figure 5:
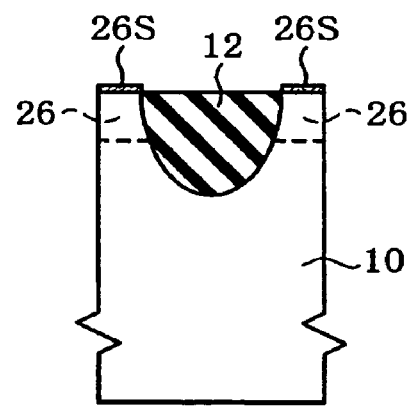
FIG. 5 shows a schematic sectional view of the resistive element along the line C—C shown FIG. 3.

FIG. 1 shows a schematic sectional view of a semiconductor device according to a first embodiment of the present invention. FIG. 2 shows schematic sectional views of a resistive element 100, a heavy insulated transistor 200, and a light insulated transistor 300 shown in FIG. 1. That is, FIG. 2 shows the resistive element 100, the heavy insulated transistor 200, and the light insulated transistor 300 by excerpting some portions of the semiconductor device shown in FIG. 1. FIG. 3 shows a schematic plan view of a resistive element layer 24 shown in FIGS. 1 and 2. FIG. 4 shows a sectional view of the resistive element 100 along the line B—B shown in FIG. 3. FIG. 5 shows a sectional view of the resistive element 100 along the line C—C shown in FIG. 3. The sectional view of the resistive element 100 shown in FIG. 2 is a sectional view along the line A—A shown in FIG. 3.

As shown in FIG. 1, the semiconductor device of the embodiment includes the resistive element 100 and the nMOS transistors (heavy insulated transistor and light insulated transistor) 200, 300. The resistive element 100 and nMOS transistors 200, 300 are integrated on a same semiconductor layer. As for the semiconductor device of the embodiment, an explanation is given to a semiconductor substrate 10 using a p-type silicone substrate as the semiconductor layer. Gate conductive layers 20SH, 20SL of the nMOS transistors 200, 300 are made from a doped polysilicon layer, and such a structure is also called as the MOS structure, usually.

As shown in FIGS. 1 through 3, the resistive element 100 includes a resistive impurity layer 24. The resistive impurity layer 24 is formed on the semiconductor substrate 10. As for the semiconductor device shown in FIGS. 1 through 3, a plurality of the resistive impurity layers 24 are formed. In this case, adjacent resistive impurity layers 24 are electrically isolated with each other by an element isolation region 12.

The embodiment shows a case, in which the element isolation region 12 is formed by semi-recessed LOCOS oxidation. The resistance value of the resistive impurity layer 24 can be set to a preferred value by appropriately adjusting types and amount of an impurity to be doped. Although the embodiment explains a case in which an n-type impurity is doped in the resistive impurity layer 24, conductivity types of impurity to be doped in the resistive impurity layer 24 are not limited to such a type.

As show in FIGS. 3 through 5, a contact impurity layer 26 is formed in the resistive element 100. The contact impurity layer 26 is continuously connected to the resistive impurity layer 24, and a contact 30 is provided on the contact impurity layer 26. To obtain a good electrical coupling with the contact 30, the contact impurity layer 26 is formed so as to contain a higher concentration of impurity than the resistive impurity layer 24. As shown in FIG. 4, the contact 30 is formed in a way such that a conductive layer 34 is embedded in a contact hole 32 formed in the insulation layer 70. On the contact 30, an interconnection layer 36 is formed. That is, the contact impurity layer 26 is electrically coupled to the interconnection layer 36 through the contact 30. To obtain a good electrical coupling at the contact 30, a silicide layer 26S is formed on the contact impurity layer 26, thereby a reduction of the resistance of the contact impurity layer 26 can be attained.

As for the semiconductor device of the embodiment, as shown in FIGS. 1 and 2, the heavy insulated transistors 200, 400 and the light insulated transistors 300, 500 as well as the resistive element 100 are integrated on the same semiconductor substrate 10.

In FIG. 1, a region HV is a region, in which the heavy insulated transistors 200, 400 are formed, and a region LV is a region, in which the light insulated transistors 300, 500 are formed. And a region HVn is a forming region for the heavy insulated N-channel MOS (nMOS) transistor 200, and a region LVn is a forming region for the light insulated N-channel MOS (nMOS) transistor 300. Similarly, a region HVp is a forming region for the heavy insulated P-channel MOS (pMOS) transistor 400, and a region LVp is a forming region for the light insulated P-channel MOS (nMOS) transistor 500. Each transistor is isolated by the element isolation region 12. The embodiment shows a case, in which the element isolation region 12 is made from semi-recessed LOCOS.

As for the semiconductor device, as shown in FIG. 1, the layer's thickness of a gate insulation layer of the heavy insulated transistors 200, 400 are formed to be thicker than the layer's thickness of a gate insulation layer of the light insulated transistors 300, 500.

As described above, the resistive element 100, and the heavy insulated transistor 200 and the light insulated transistor 300 that are nMOS, are excerpted and shown in FIG. 2.

The heavy insulated transistor 200 and the light insulated transistor 300 are insulation gate type transistors having different drain-source breakdown voltages. As shown in FIG. 1, the semiconductor device has a triple well structure. Specifically, in the region HV, an n-type well 51 is formed in the semiconductor substrate 10 made from a p-type silicone substrate, and a p-type well 11 is formed in the n-type well 51. Furthermore, as shown in FIG. 1, an n-type well 41 and a p-type well 61 are formed in the semiconductor substrate 10.

The transistor 200 is formed in the triple well structure. Specifically, as shown in FIG. 1, the heavy insulated transistor 200 is formed in the p-type well 1 formed in the n-type well 51. In addition, the light insulated transistor 300 is formed in a p-type well 61.

As shown in FIGS. 1 and 2, the heavy insulated transistor 200 includes a gate insulation layer 14H and a gate conductive layer 16H. The gate conductive layer 16H is formed above the gate insulation layer 14H. And a silicide layer 20SH can be formed on the gate conductive layer 16H.

Furthermore, the heavy insulated transistor 200 includes an n-type source region 17 and an n-type drain region 19. The source region 17 and the drain region 19 are formed so as to interpose the gate conductive layer 16H therebetween. The source region 17 and the drain region 19 are formed in an offset region 37 and an offset region 39, respectively. And a silicide layer 17S and a silicide layer 19S can be formed on the source region 17 and the drain region 19, respectively.

As shown in FIGS. 1 and 2, the light insulated transistor 300 includes a gate insulation layer 28L and a gate conductive layer 16L. The gate conductive layer 16L is formed on the gate insulation layer 28L. And a silicide layer 20SL can be formed on the gate conductive layer 16L.

Furthermore, the light insulated transistor 300 includes an n-type source region 47 and an n-type drain region 49. The source region 47 and the drain region 49 are formed so as to interpose the gate conductive layer 16L therebetween. The source region 47 and the drain region 49 are formed in an offset region 27 and an offset region 29, respectively. And a silicide layer 47S and a silicide layer 49S can be formed on the source region 27 and the drain region 29, respectively.

The gate insulation layers 14H, 28L are made from, for example, a silicon oxide layer, and the gate conductive layers 16H, 16L are made from a doped polysilicon layer.

Next, a manufacturing method of the semiconductor device in the embodiment will be explained by referring to FIGS. 1 through 25. Sectional views of FIG. 6, FIG. 7, FIGS. 9 through 20, FIG. 22 and FIG. 23 correspond to a sectional view of the semiconductor device shown in FIG. 2. Hereinafter, a region, in which the resistive element 100 is formed, is referred to as "the forming region 100a for the resistive element," a region, in which the heavy insulated transistor (HVn) 200 is formed, is referred to "the forming region 200a for the MOS transistor," and a region, in which the light insulated transistor (LVn) 300 is formed, is referred to "the forming region 300a for the MOS transistor."

Figure 6:
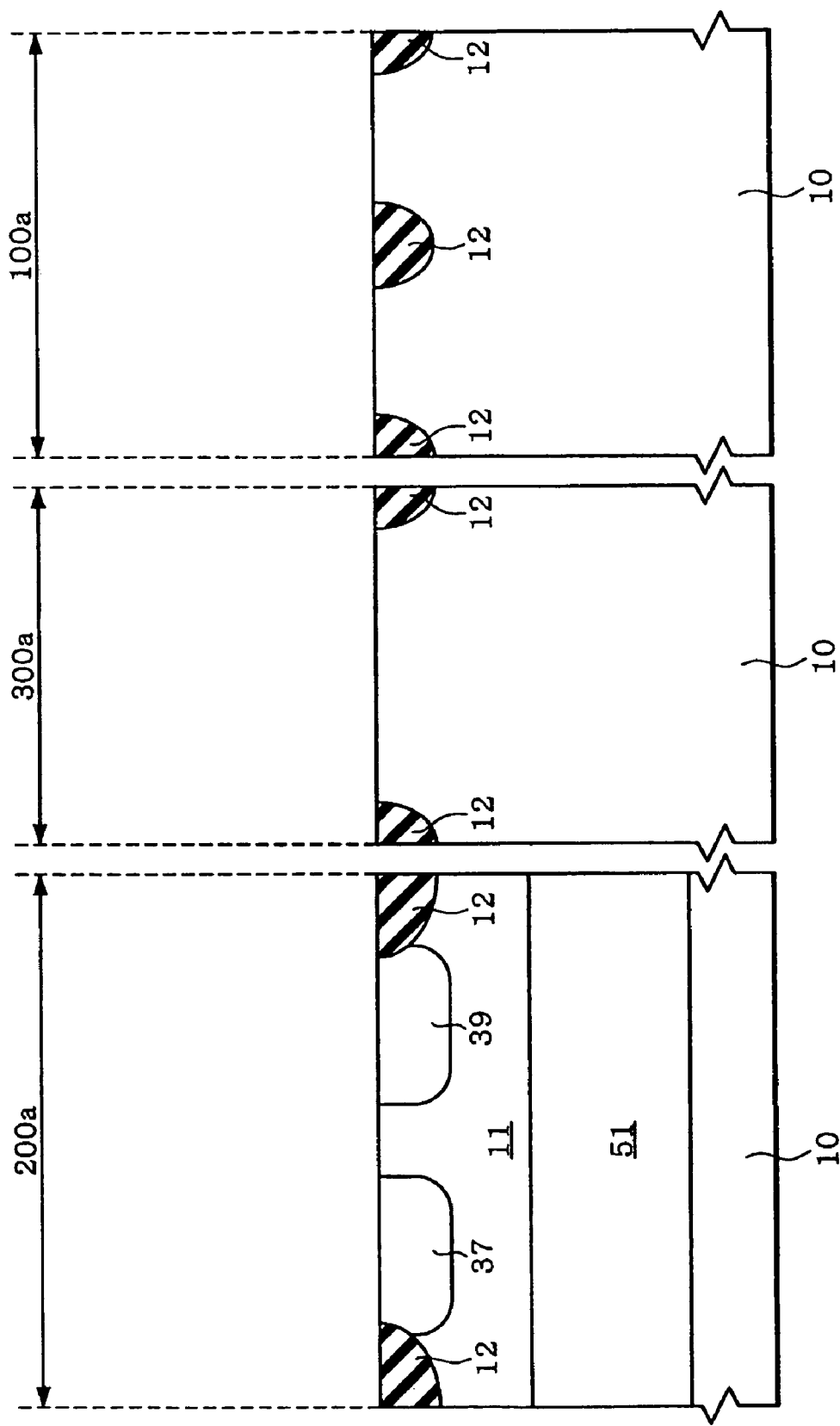
FIG. 6 shows a schematic sectional view illustrating a step of the manufacturing method of the semiconductor device shown in FIGS. 1 and 2.

(A) At first, the element isolation region 12 is formed on the surface of the semiconductor substrate 10 (refer to FIGS. 1 and 6). Specifically, the element isolation region 12 is formed by semi-recessed LOCOS method.

(B) Next, a well is formed for the heavy insulated transistor 200 (refer to FIGS. 1 and 6).

Specifically, by doping an impurity to a predetermined region using a resist mask (not shown) formed by a general photolithography, the n-type well (n-well) 51 is formed in the region HV. Furthermore, in the region HVn of the n-well 51, a p-type well (p-well) 11 is formed (refer to FIG. 1). The heavy insulated pMOS transistor 400 is formed in the n-well 51, and the heavy insulated nMOS transistor 200 is formed in the p-well 11.

(C) Next, the offset regions 37, 39 for the source and the drain of the heavy insulated transistor 200 are formed (refer to FIGS. 1, 2 and 6).

Specifically, by doping an n-type impurity to the forming region 200a for the heavy insulated transistor, the offset regions 37, 39 for the source and the drain are formed.

Figure 7:
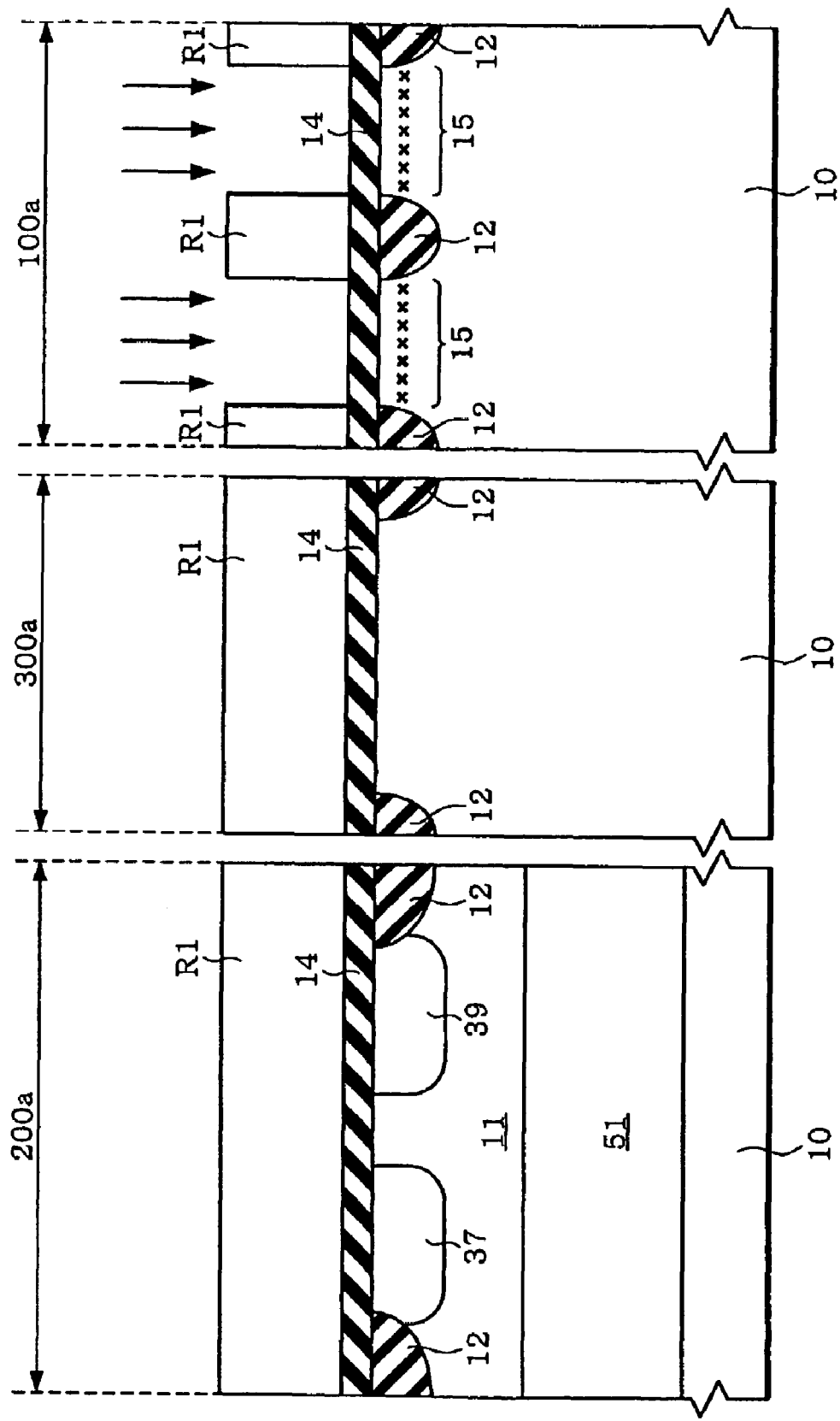
FIG. 7 shows a schematic sectional view illustrating a step of the manufacturing method of the semiconductor device shown in FIGS. 1 and 2.

(D) Next, an insulation layer (first insulation layer 14) for forming the gate insulation layer 14H (refer to FIGS. 1 and 2) of the heavy insulated transistor 200 is formed on the semiconductor substrate 10 (refer to FIG. 7).

Specifically, by oxidizing the surface of the semiconductor substrate 10 by thermal oxidation, the first insulation layer 14 made from silicon oxide is formed on the entire surface of the semiconductor substrate 10.

(E) Next, an impurity (first impurity) for forming the resistive impurity layer 24 is doped to an active region 15 in the forming region 100a for the resistive element (refer to FIG. 7). That is, the first impurity is an impurity, which is doped for forming the resistive impurity layer 24 consisting the resistive element 100. FIG. 7 shows a schematic sectional view illustrating a step of doping the first impurity to the active region 15 for forming the resistive impurity layer 24 of the resistive element 100.

Specifically, as shown in FIG. 7, a resist layer R1 is formed above the semiconductor substrate 10. As for the embodiment, a pattern of the resist layer R1 covers the forming region 200a for the heavy insulated transistor and the forming region 300a for the light insulated transistor, and has openings in the forming region 100a for the resistive element. The openings are formed in a portion in which the surface of the semiconductor substrate 10 is exposed under the first insulation layer 14 in the forming region 100a for the resistive element. That is, the openings are not formed above the element isolation region 12 in the forming region 100a for the resistive element, and the surface of the element isolation region 12 is covered by the resist layer R1.

Next, the first impurity is doped by ion implantation using the resist layer R1 as a mask. Although the embodiment explains a case, in which an n-type impurity layer is doped as the first impurity, conductivity types and kinds of the first impurity are not limited to particular one. In FIG. 7, the impurity is doped to portions indicated by "x" in the forming region 100a for the resistive element. Accordingly, the resistive impurity layer 24 is formed in the active region 15 isolated by the element isolation region 12 (refer to FIG. 9).

Figure 8:
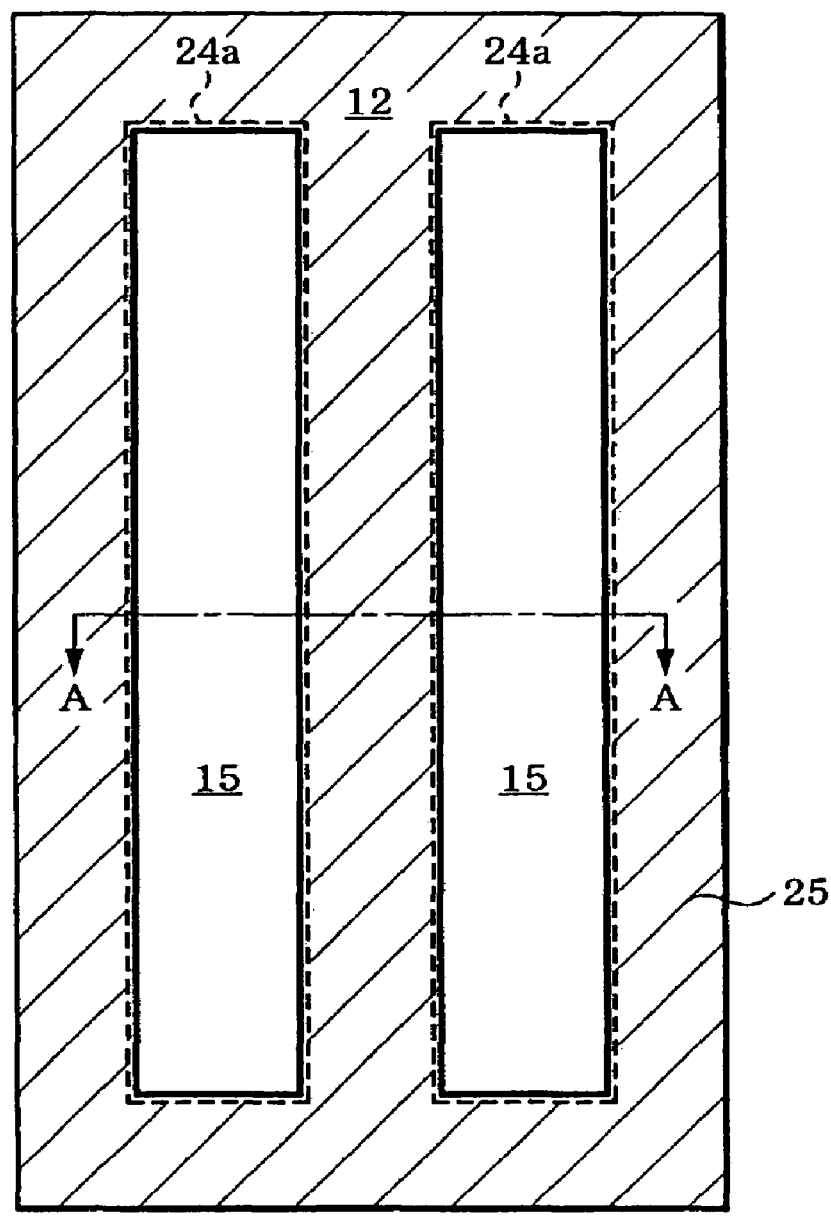
FIG. 8 shows a schematic plan view illustrating a forming region for a resistive impurity layer in the step shown in FIG. 7.

FIG. 8 shows a plan view of the forming region 100a for the resistive element in the step. In FIG. 8, a region surrounded by the dotted-line is a first impurity-doping region (a region, in which the first impurity is doped) 24a. That is, as shown in FIG. 8, the first impurity is doped to the active region 15 of the forming region 100a for the resistive element. On the contrary, in FIG. 8, a region, in which the first impurity is not doped (first impurity-doping forbidden region) 25 is shown by cross-hatching.

The first impurity-doping forbidden region 25 is formed on the element isolation region 12. In addition, the first impurity-doping forbidden region 25 is formed in a way so as to isolate, at least, adjacent first impurity-doping regions 24a. Specifically, in FIG. 8, the first impurity is not doped to the element isolation region 12. Accordingly, a characteristic change of the element isolation region 12 can be prevented, and an insulation of the element isolation region 12 can be enhanced. After doping the first impurity, the resist layer R1 is removed.

Figure 9:
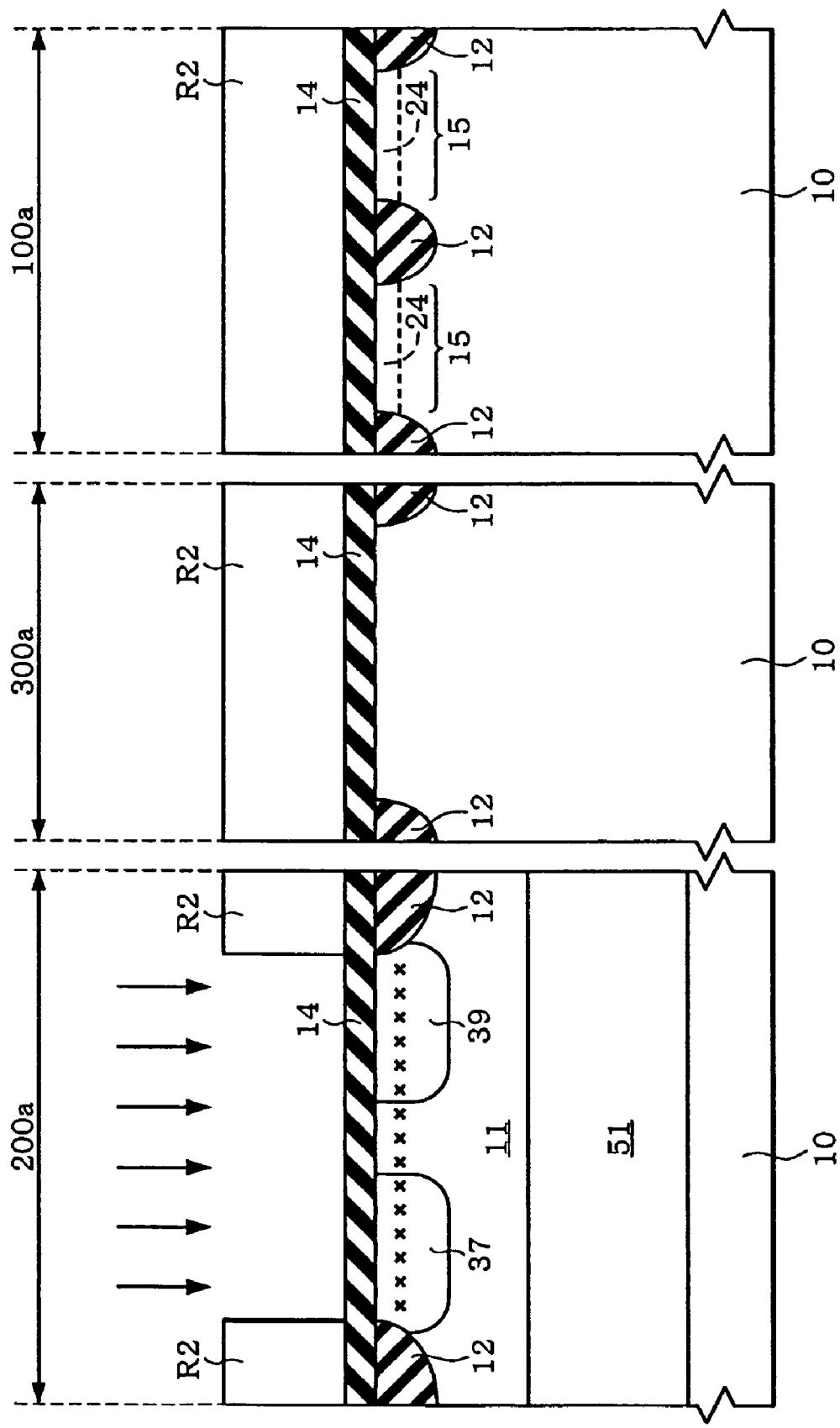
FIG. 9 shows a schematic sectional view illustrating a step of the manufacturing method of the semiconductor device shown in FIGS. 1 and 2.
Figure 10:
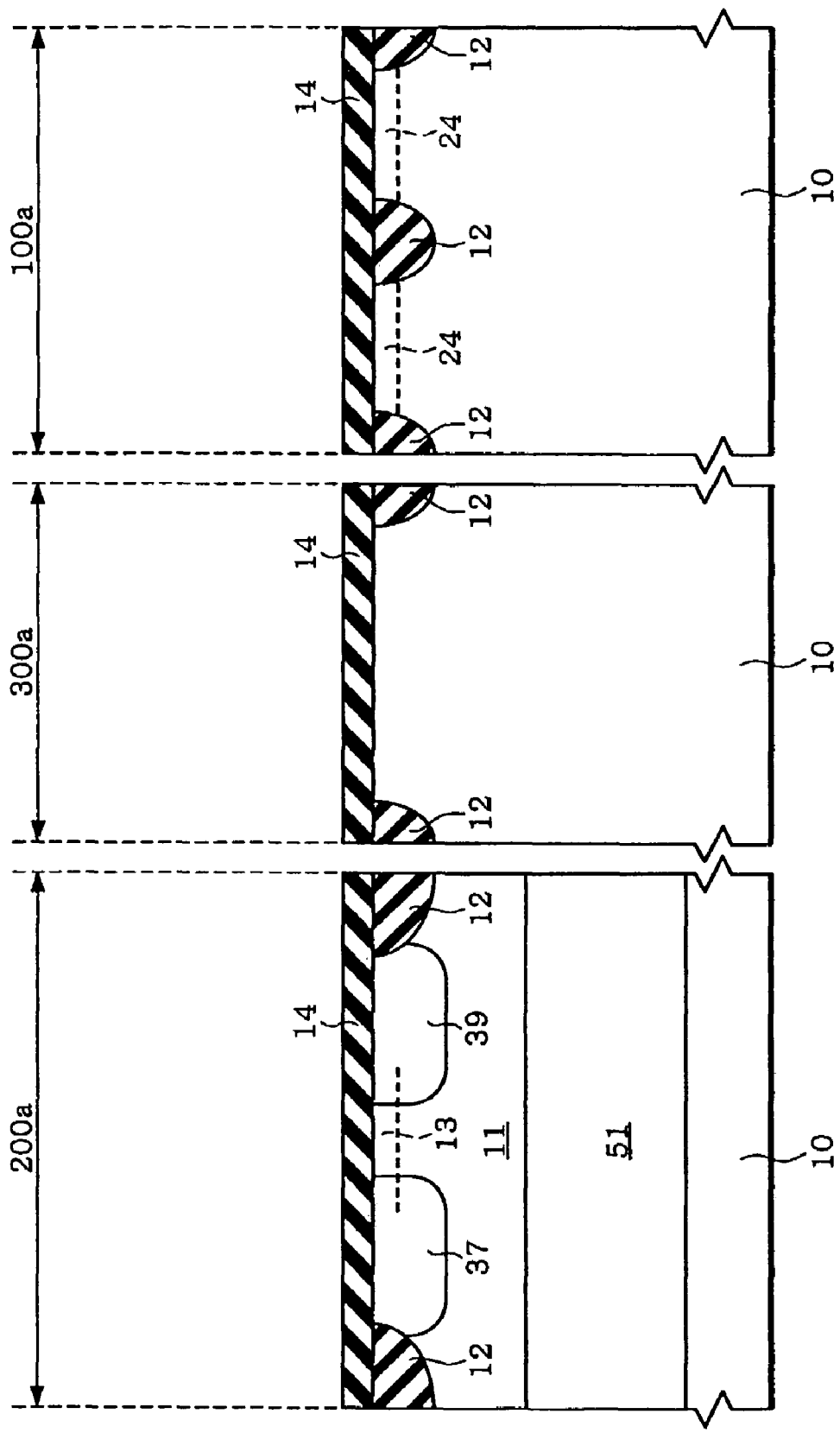
FIG. 10 shows a schematic sectional view illustrating a step of the manufacturing method of the semiconductor device shown in FIGS. 1 and 2.

(F) Next, a channel region 13 of the heavy insulated transistor 200 is formed (refer to FIGS. 9 and 10). Specifically, an impurity is doped to the channel region to adjust a threshold voltage value of the heavy insulated transistor 200. FIGS. 9 and 10 show schematic sectional views illustrating a step of forming the channel region 13 of the heavy insulated transistor 200.

At first, a resist layer R2 is formed on the first insulation layer 14. The resist layer R2 has openings in the forming region 200a for the heavy insulated transistor, and covers the forming region 100a for the resistive element and the forming region 300a for the light insulated transistor. Through openings of the resist layer R2, an n-type impurity is doped to the semiconductor substrate 10 by ion implantation. In FIG. 9, the impurity is doped to portions indicated by "x" in the forming region 200a for the heavy insulated transistor. Accordingly, the channel region 13 of the heavy insulated transistor 200 is formed (refer to FIG. 10). After doping the impurity, the resist layer R2 is removed.

Figure 11:
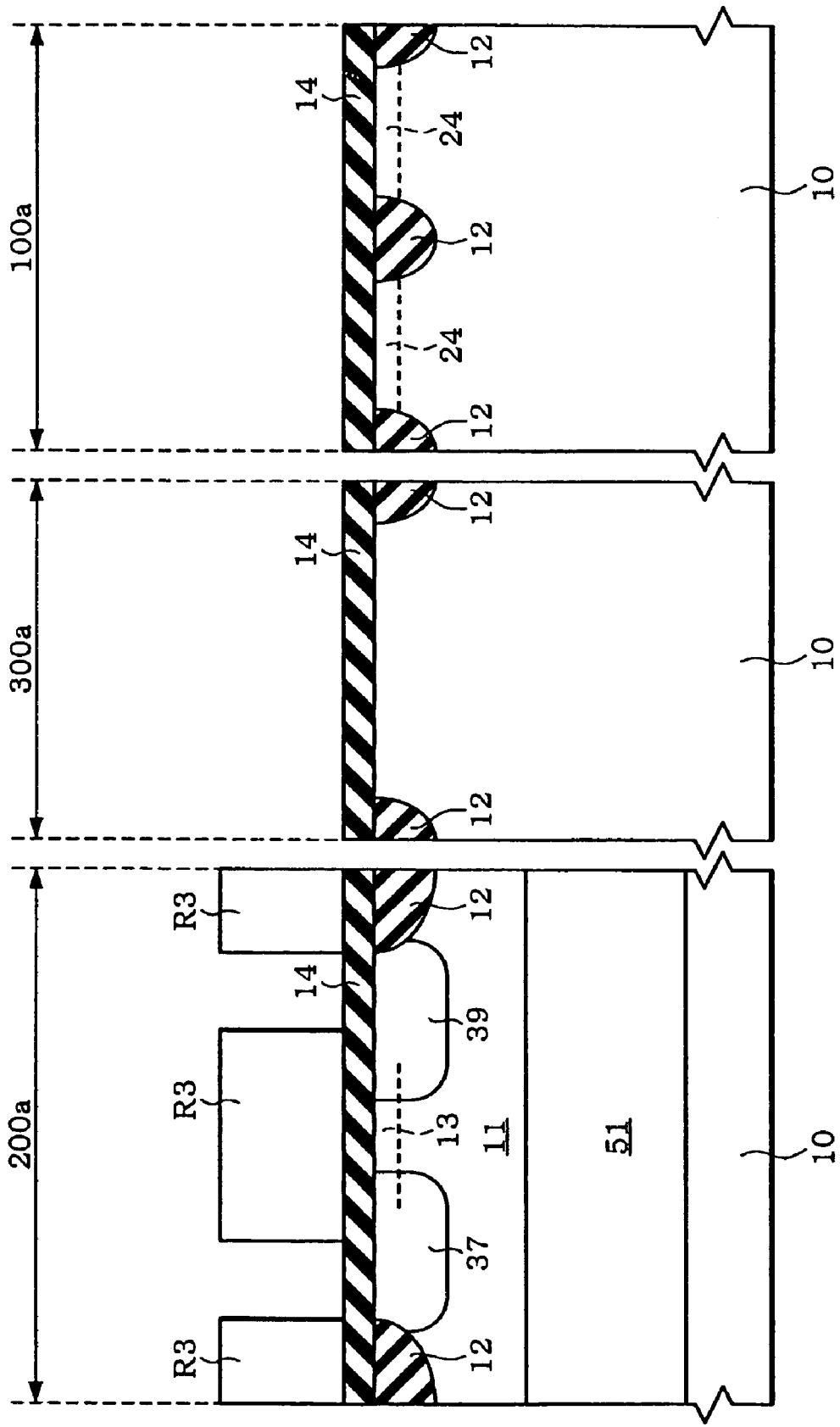
FIG. 11 shows a schematic sectional view illustrating a step of the manufacturing method of the semiconductor device shown in FIGS. 1 and 2.
Figure 12:
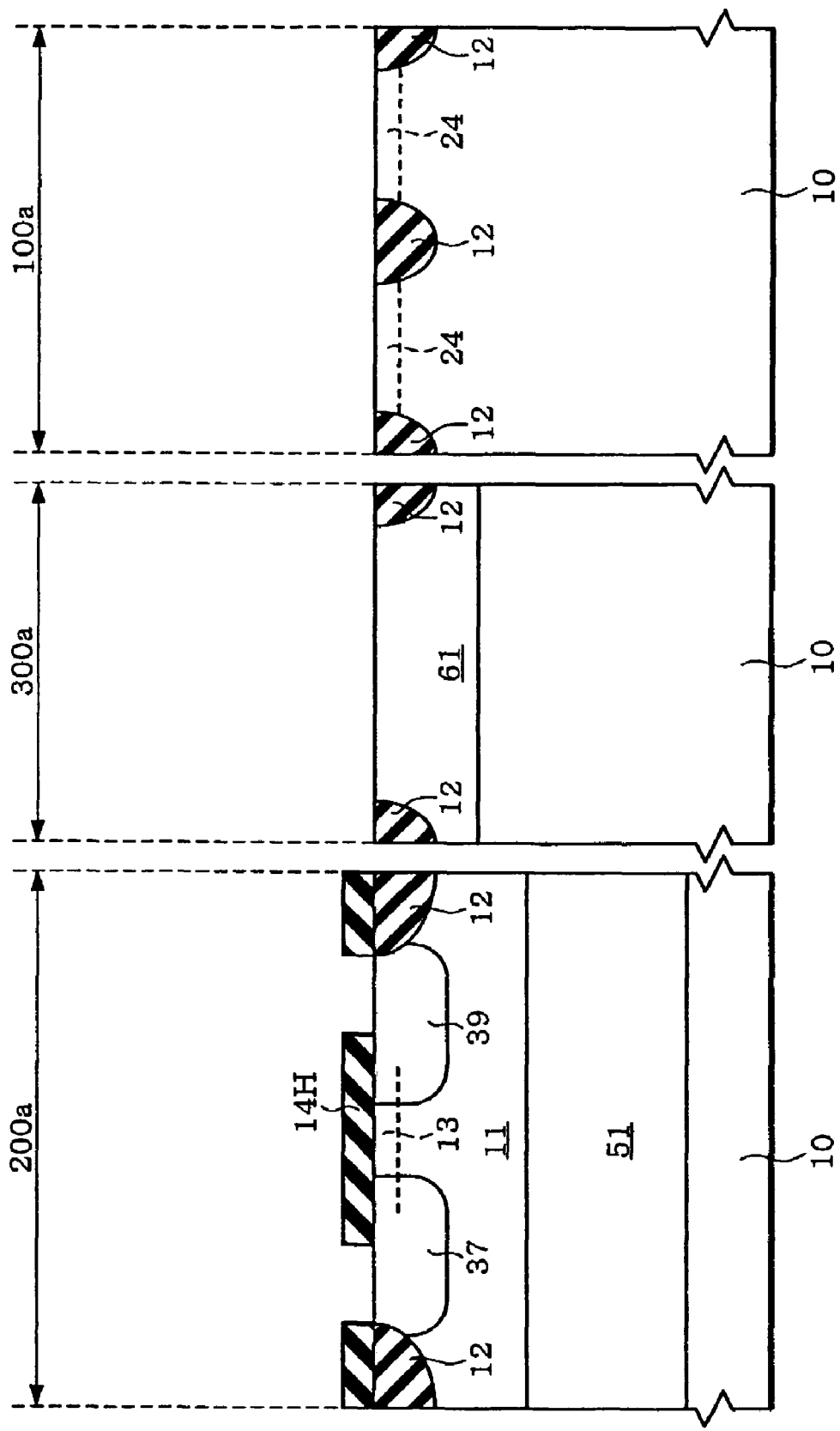
FIG. 12 shows a schematic sectional view illustrating a step of the manufacturing method of the semiconductor device shown in FIGS. 1 and 2.
Figure 13:
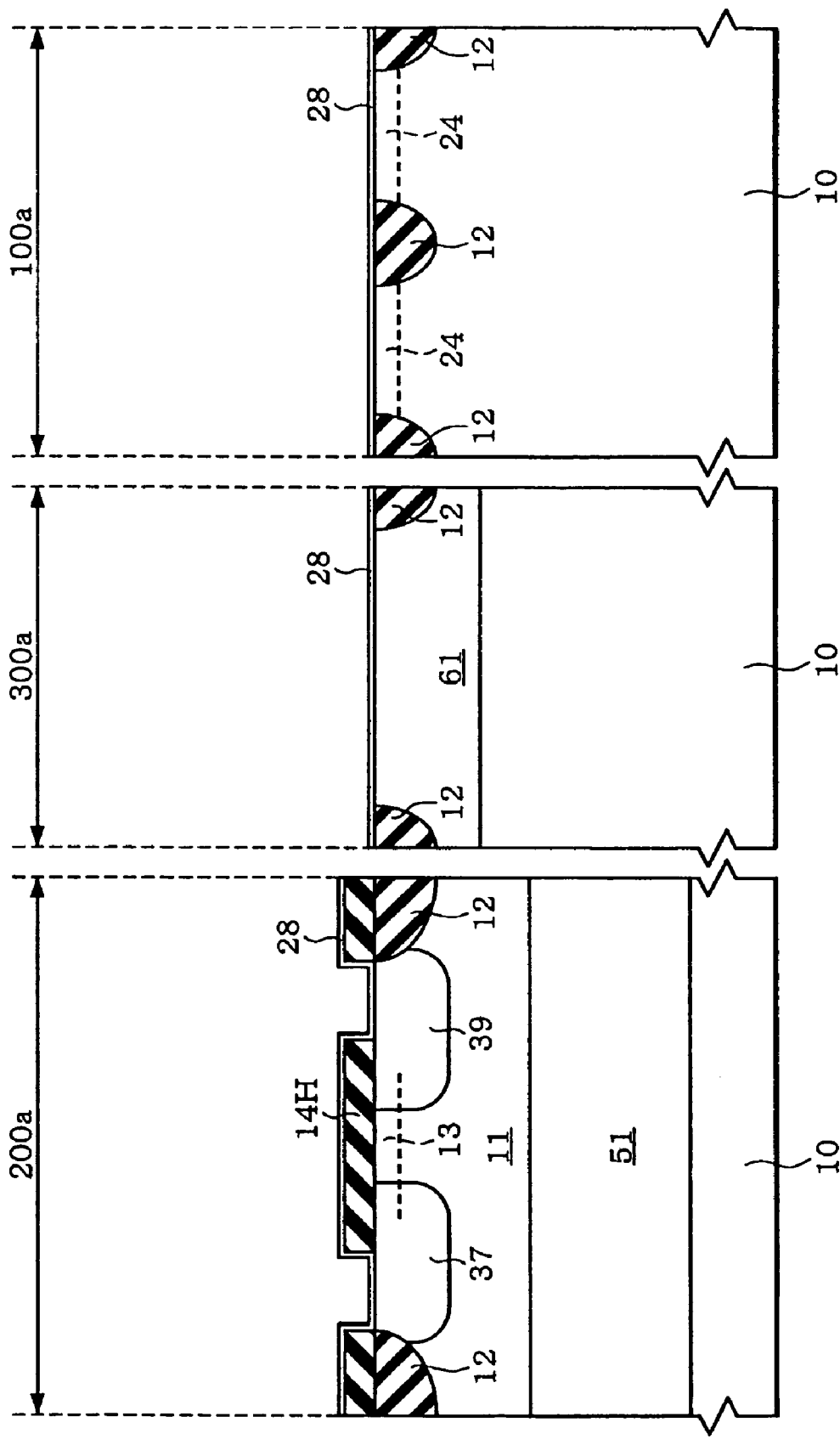
FIG. 13 shows a schematic sectional view illustrating a step of the manufacturing method of the semiconductor device shown in FIGS. 1 and 2.

(G) Next, the gate insulation layer 14H of the heavy insulated transistor 200 is formed (refer to FIGS. 11 and 12). FIGS. 11 and 12 show schematic sectional views illustrating a step of forming the gate insulation layer 14H of the heavy insulated transistor 200.

Specifically, as shown in FIG. 11, a resist layer R3 is formed on the first insulation layer 14. As for the embodiment, in the forming region 200a for the heavy insulated transistor, a pattern of the resist layer R3 covers a region of the first insulation layer 14, which is used as the gate insulation layer 14H of the heavy insulated transistor 200, and has openings in the forming region 100a for the resistive element and the forming region 300a for the light insulated transistor. Next, the first insulation layer 14 is etched using the resist layer R3 as a mask, and the gate insulation layer 14H is formed. As for the etching, wet etching using an etchant such as hydrofluoric acid can be employed. In the step, the first insulation layer 14, formed on the forming region 100a for the resistive element and the forming region 300a for the light insulated transistor, is removed. A final layer's thickness of the gate insulation layer 14H becomes thicker by conducting the step described later.

(H) Next, a well 61 for the light insulated transistor 300 is formed (refer to FIGS. 1 and 12).

Specifically, by doping an impurity to a predetermined region using a resist mask (not shown) formed by a general photolithography, an n-type well (n-well) 41 for forming the light insulated pMOS transistor 500 is formed in the region LVp, and a p-type well (p-well) 61 for forming the light insulated nMOS transistor 300 is formed in the region LVn (refer to FIG. 1). In the step, a p-type well is also formed in the forming region for the resistive element 100 at the same time.

Figure 14:
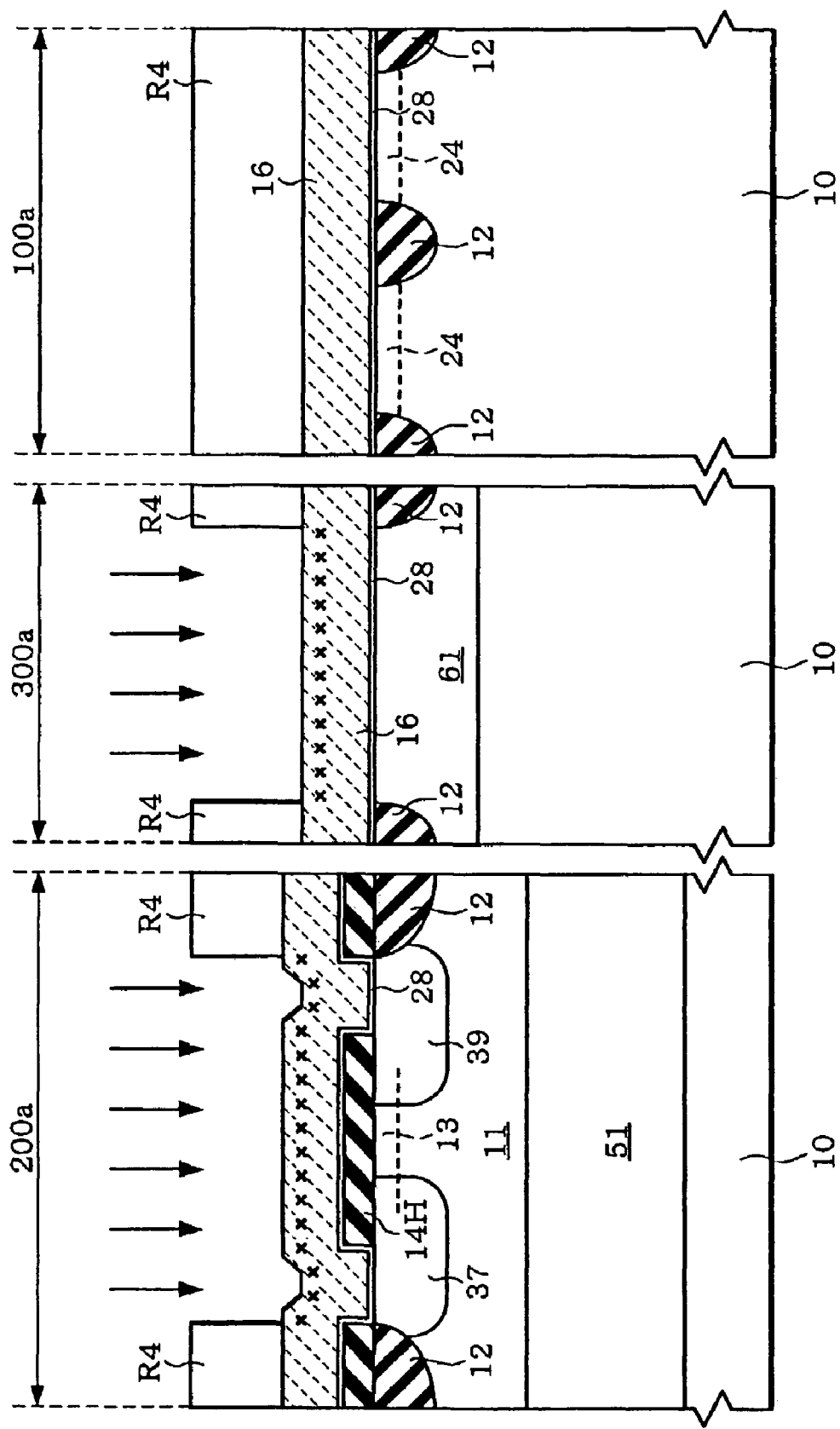
FIG. 14 shows a schematic sectional view illustrating a step of the manufacturing method of the semiconductor device shown in FIGS. 1 and 2.
Figure 15:
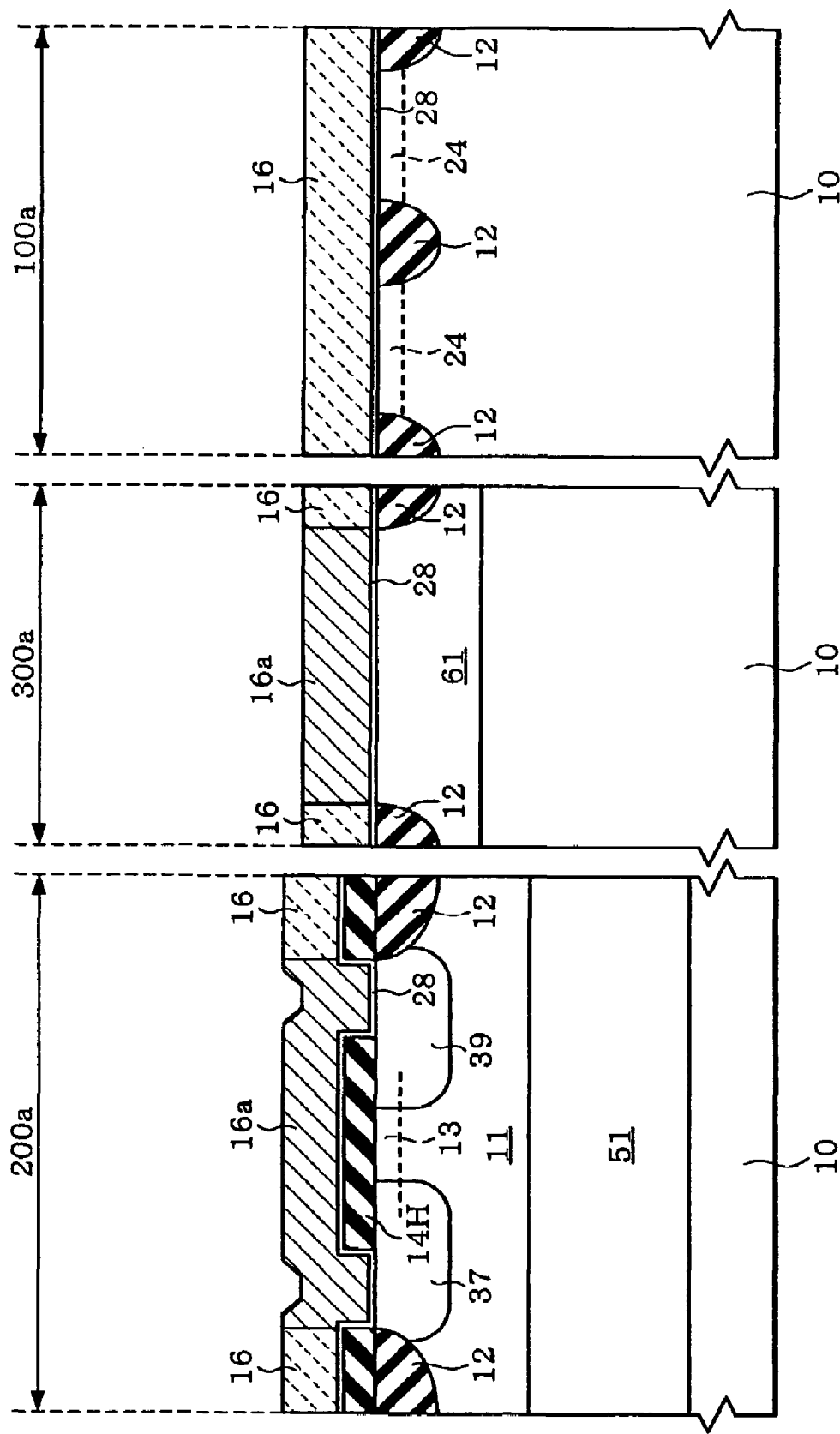
FIG. 15 shows a schematic sectional view illustrating a step of the manufacturing method of the semiconductor device shown in FIGS. 1 and 2.
Figure 16:
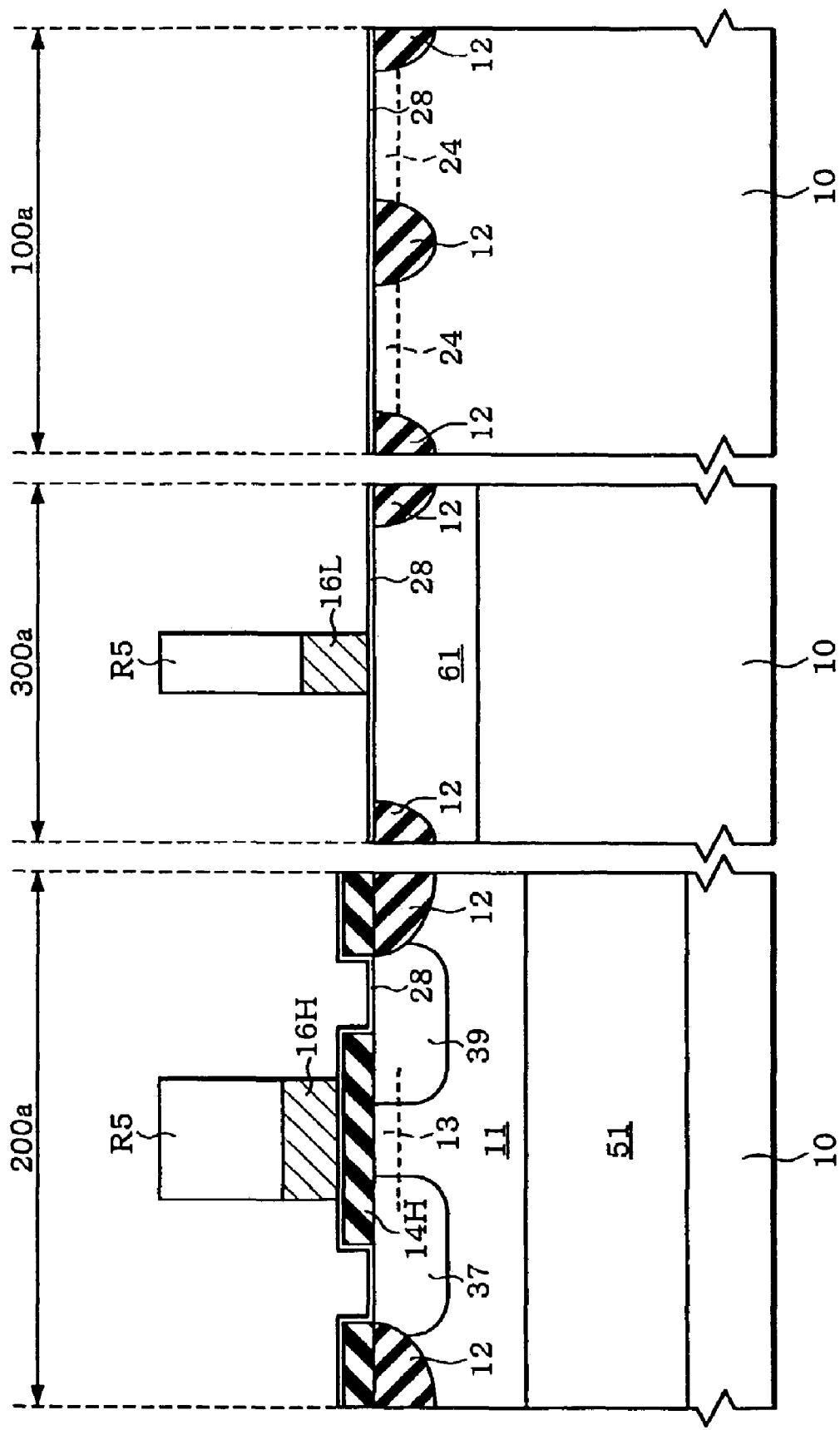
FIG. 16 shows a schematic sectional view illustrating a step of the manufacturing method of the semiconductor device shown in FIGS. 1 and 2.

Next, a second insulation layer 28 is formed by thermal oxidation (refer to FIGS. 14 through 16). The second insulation layer 28 is used as the gate insulation layer 28L of the light insulated transistor 300 (refer to FIG. 2). Specifically, the second insulation layer 28 is etched, and the gate insulation layer 28L is formed in the step (L) described later.

(I) Next, gate conductive layers 16H, 16L for the transistors 200, 300 are formed (refer to FIGS. 14 through 16). FIGS. 14, 15, and 16 show schematic sectional views illustrating a step of forming the gate conductive layer 16H of the heavy insulated transistor 200 and the gate conductive layer 16L of the light insulated transistor 300.

Specifically, as shown in FIG. 14, a polysilicon layer 16 is deposited on the entire surface of the semiconductor substrate 10 at first. Next, a resist layer R4 is formed. The resist layer R4 has openings on regions used as the gate conductive layers 16H, 16L of the heavy insulated transistor 200 and the light insulated transistor 300 in the polysilicon layer 16. Through openings of the resist layer R4, an n-type impurity is doped in the polysilicon layer 16 by ion implantation. After doping the impurity, the resist layer R4 is removed.

Next, by conducting heat treatment, the doped impurity is diffused in the polysilicon layer 16. And as shown in FIG. 15, a doped polysilicon layer 16a is formed, at least, in regions, in which the gate conductive layers 16H, 16L of the heavy insulated transistor 200 and the light insulated transistor 300 are formed.

Next, a resist layer R5 is formed to protect portions to become the gate conductive layers 16H, 16L of each of the transistors 200, 300 (refer to FIG. 16). Then, unnecessary portions of the polysilicon layer 16, exposed through openings of the resist layer R5, is removed by etching. Accordingly, as shown in FIG. 16, the gate conductive layer 16H of the heavy insulated transistor 200 and the gate conductive layer 16L of the light insulated transistor 300 are formed. Then, the resist layer R5 is removed.

Figure 17:
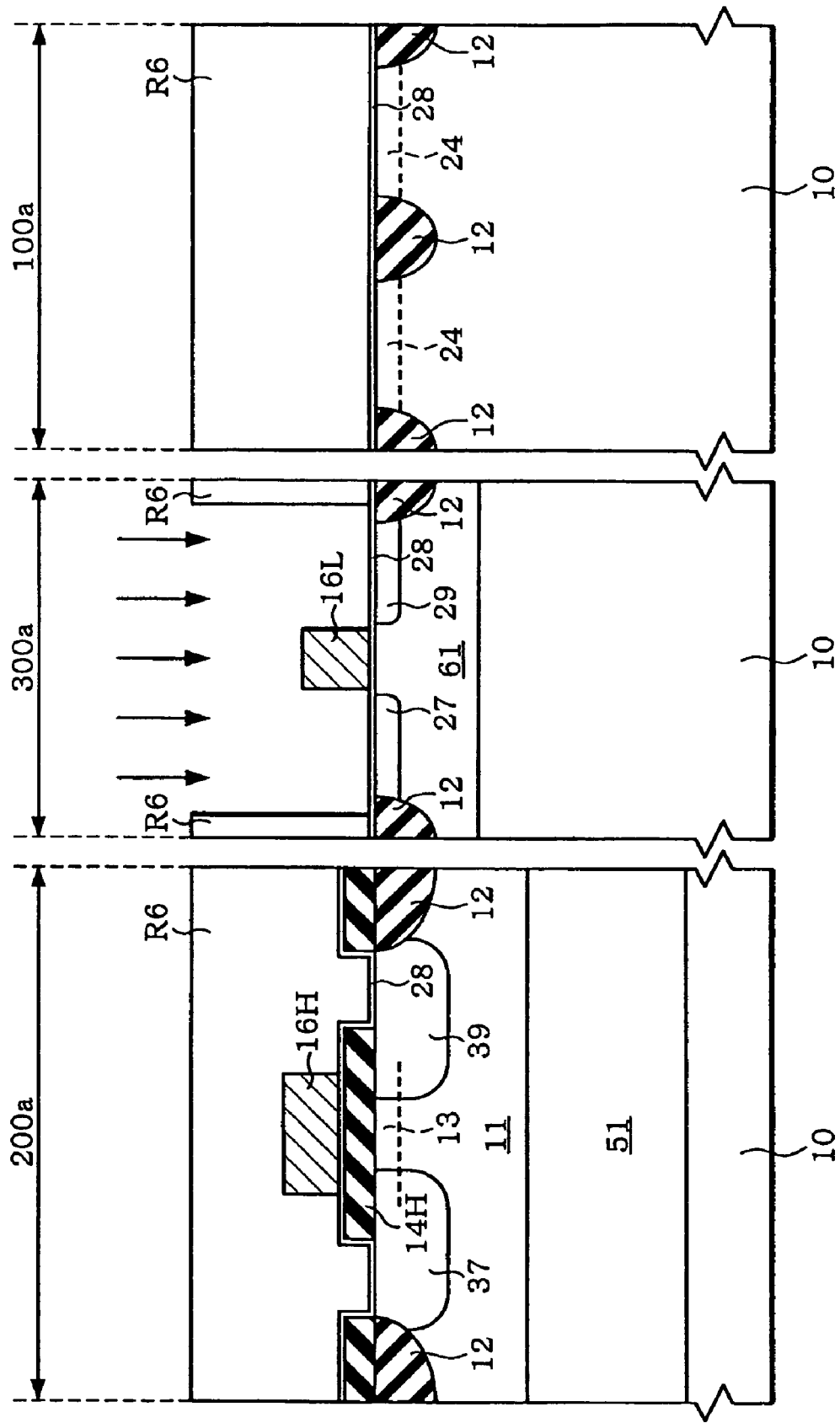
FIG. 17 shows a schematic sectional view illustrating a step of the manufacturing method of the semiconductor device shown in FIGS. 1 and 2.

(J) Next, a source offset region 27 and a drain offset region 29 of the light insulated transistor 300 are formed (refer to FIG. 17). FIG. 17 shows a schematic sectional view illustrating a step of forming the source offset region 27 and the drain offset region 29 of the light insulated transistor 300.

Specifically, a resist layer R6 is formed above the semiconductor substrate 10. The resist layer R6 has openings in the forming region 300a for the light insulated transistor. Through openings of the resist layer R6, an n-type impurity is doped to the semiconductor substrate 10 by ion implantation. Accordingly, the source offset region 27 and the drain offset region 29 of the light insulated transistor 300 are formed as shown in FIG. 17. After doping the impurity, the resist layer R6 is removed.

Figure 18:
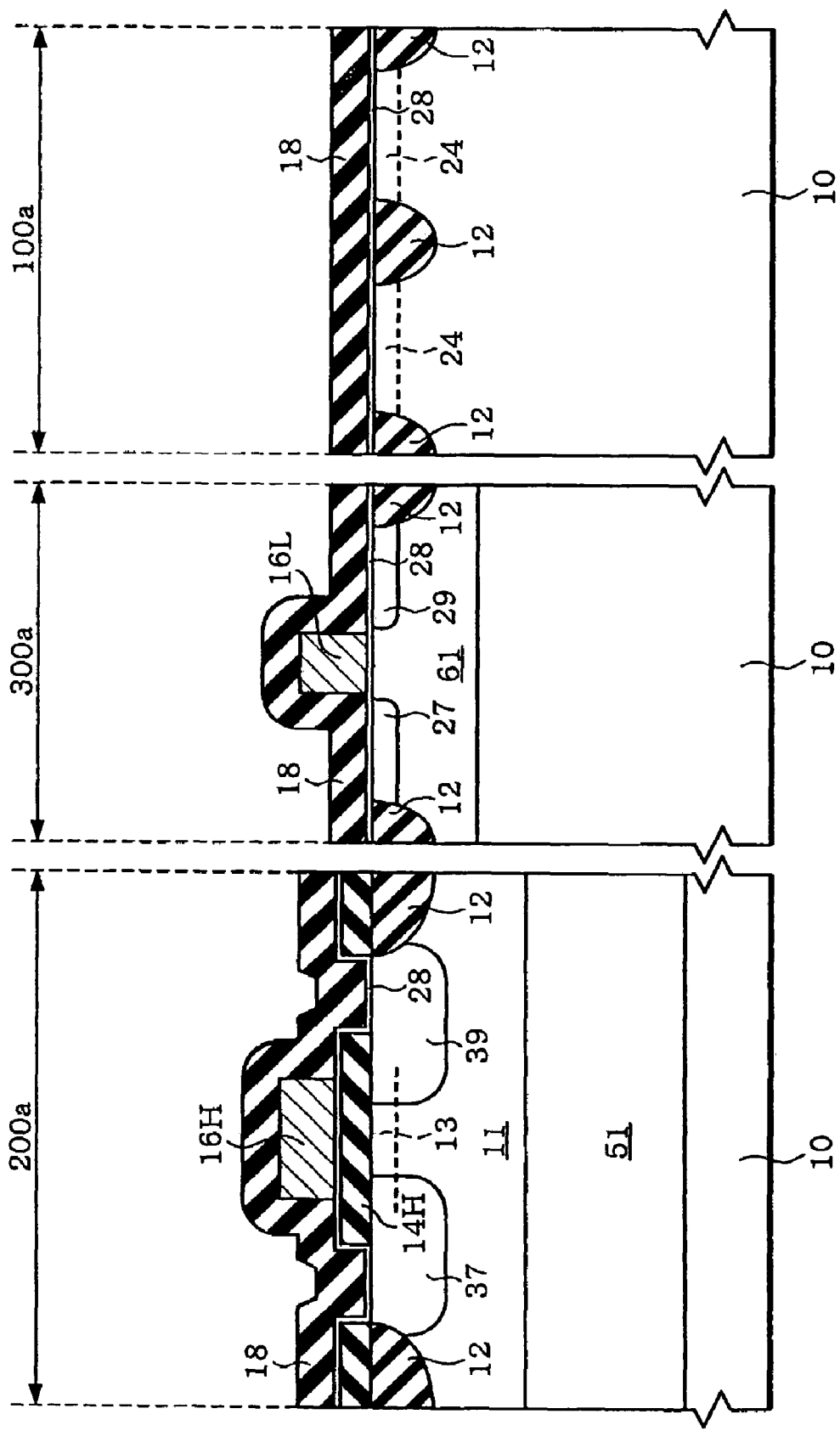
FIG. 18 shows a schematic sectional view illustrating a step of the manufacturing method of the semiconductor device shown in FIGS. 1 and 2.
Figure 19:
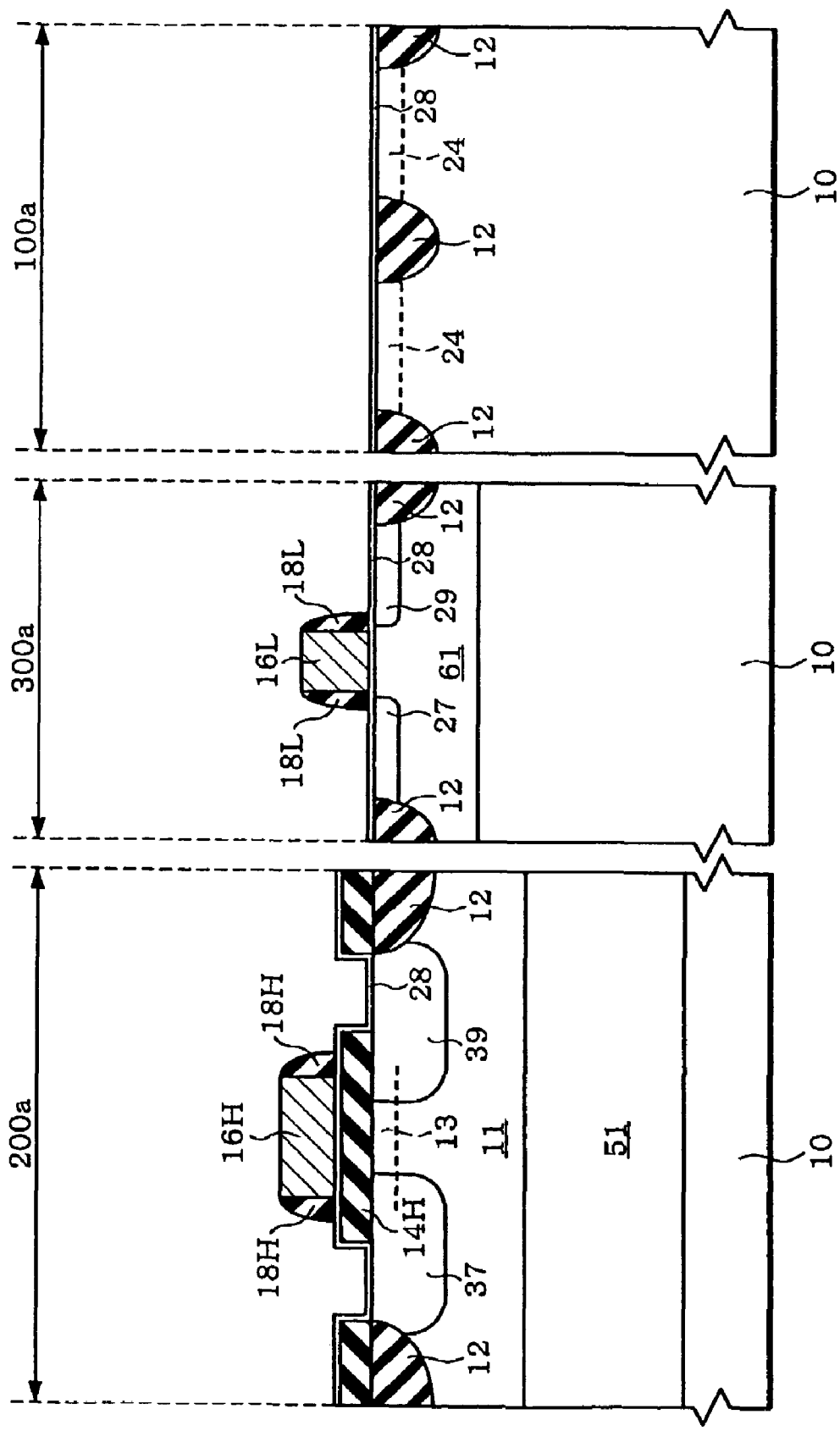
FIG. 19 shows a schematic sectional view illustrating a step of the manufacturing method of the semiconductor device shown in FIGS. 1 and 2.

(K) Next, side wall insulation layers 18H, 18L of the transistors 200, 300 are formed (refer to FIGS. 18 and 19). FIGS. 18 and 19 show schematic sectional views illustrating a step of forming the side wall insulation layers 18H, 18L of the transistors 200, 300.

Specifically, as shown in FIG. 18, after a third insulation layer 18 is formed above the entire semiconductor substrate 10, the third insulation layer 18 is etched by anisotropic etching such as reactive ion etching (RIE). Accordingly, the side wall insulation layer 18H is formed on each side surface of the gate conductive layer 16H, and the side wall insulation layer 18L is formed on each side surface of the gate conductive layer 16L as shown in FIG. 19.

In the step described later, the side wall insulation layer 18L functions as a mask to form a source region 47 and a drain region 49.

Figure 20:
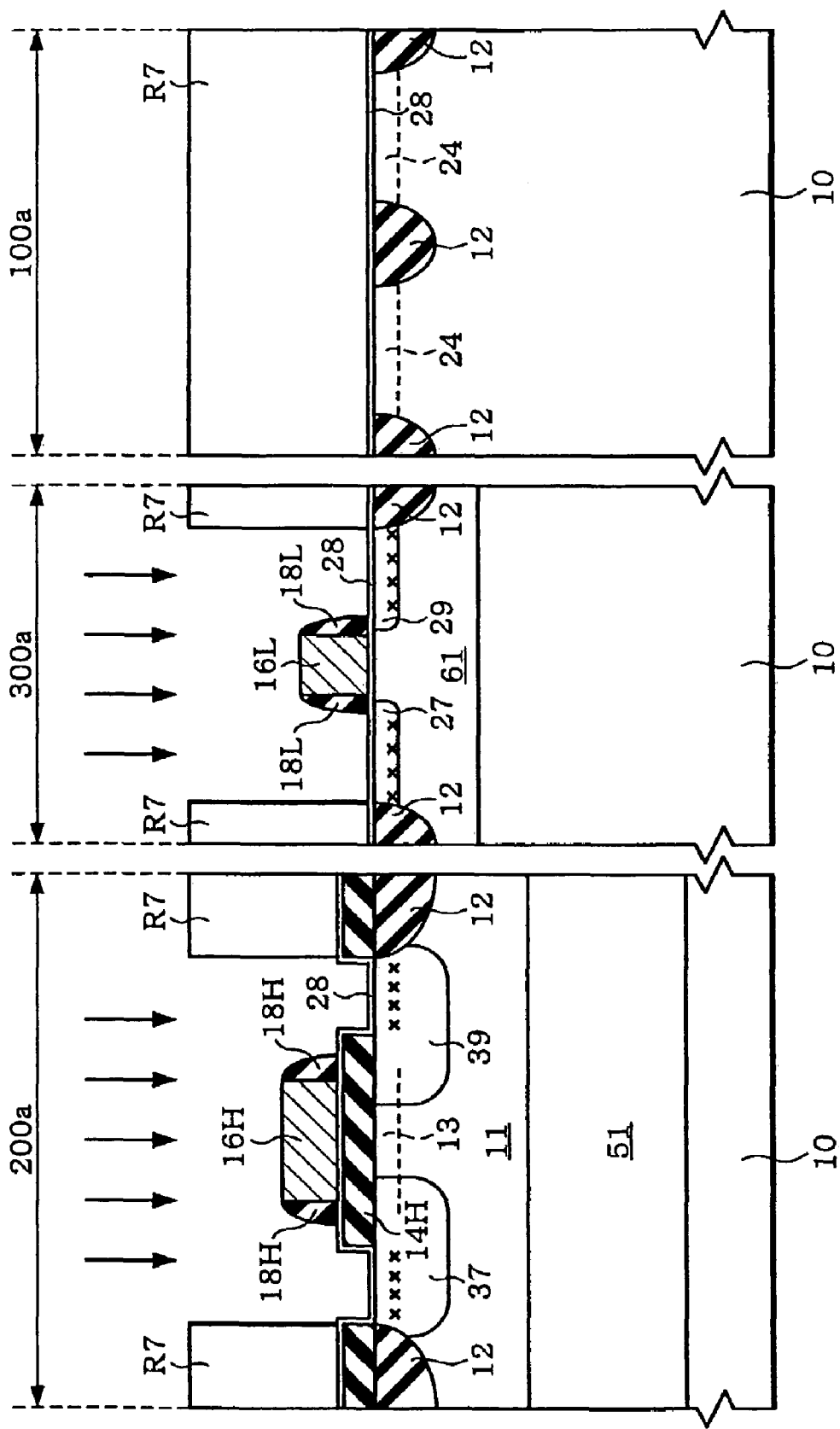
FIG. 20 shows a schematic sectional view illustrating a step of the manufacturing method of the semiconductor device shown in FIGS. 1 and 2.
Figure 21:
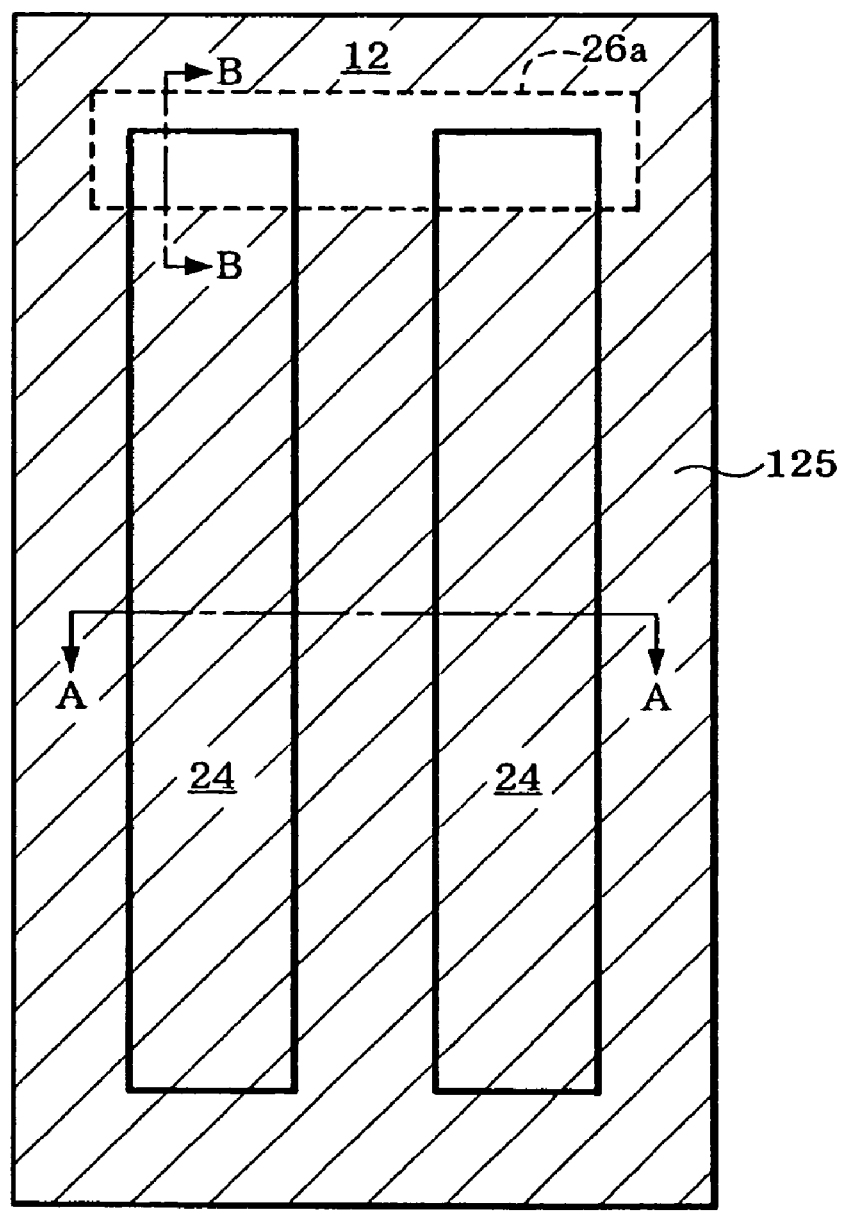
FIG. 21 shows a schematic plan view of a forming region for a resistive impurity layer in the step shown in FIG. 20.
Figure 22:
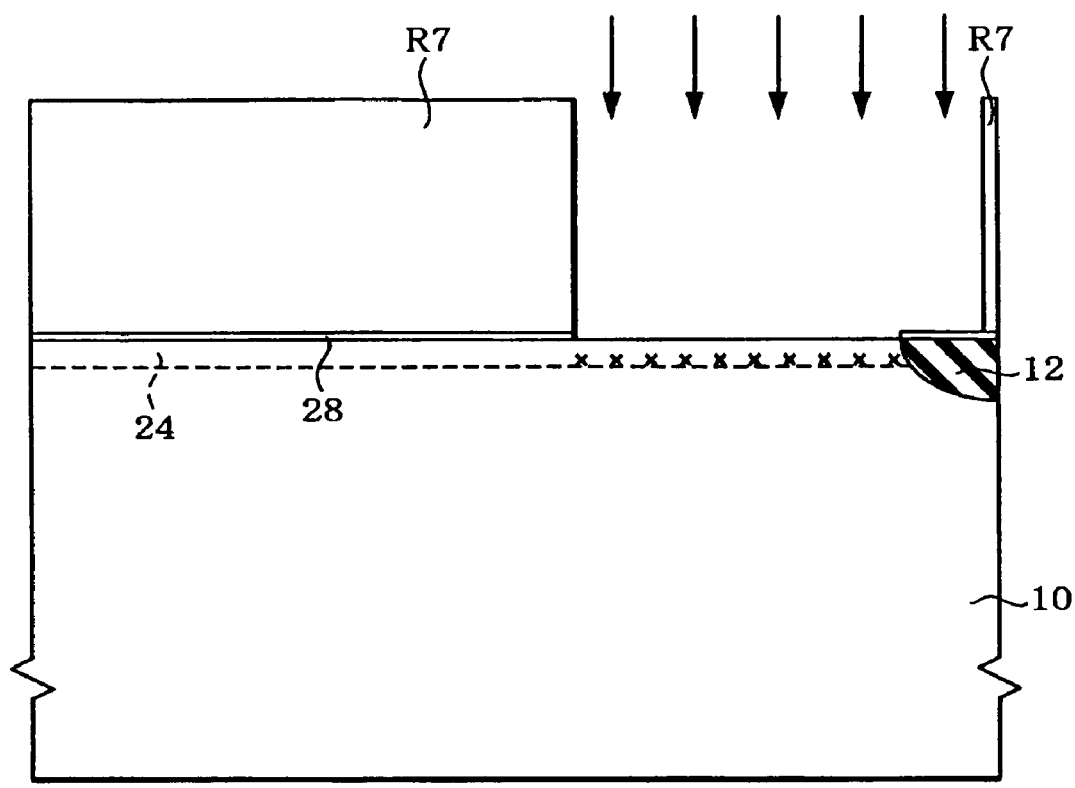
FIG. 22 shows a schematic sectional view of the forming region for the resistive impurity layer along the line B—B in FIG. 21.
Figure 23:
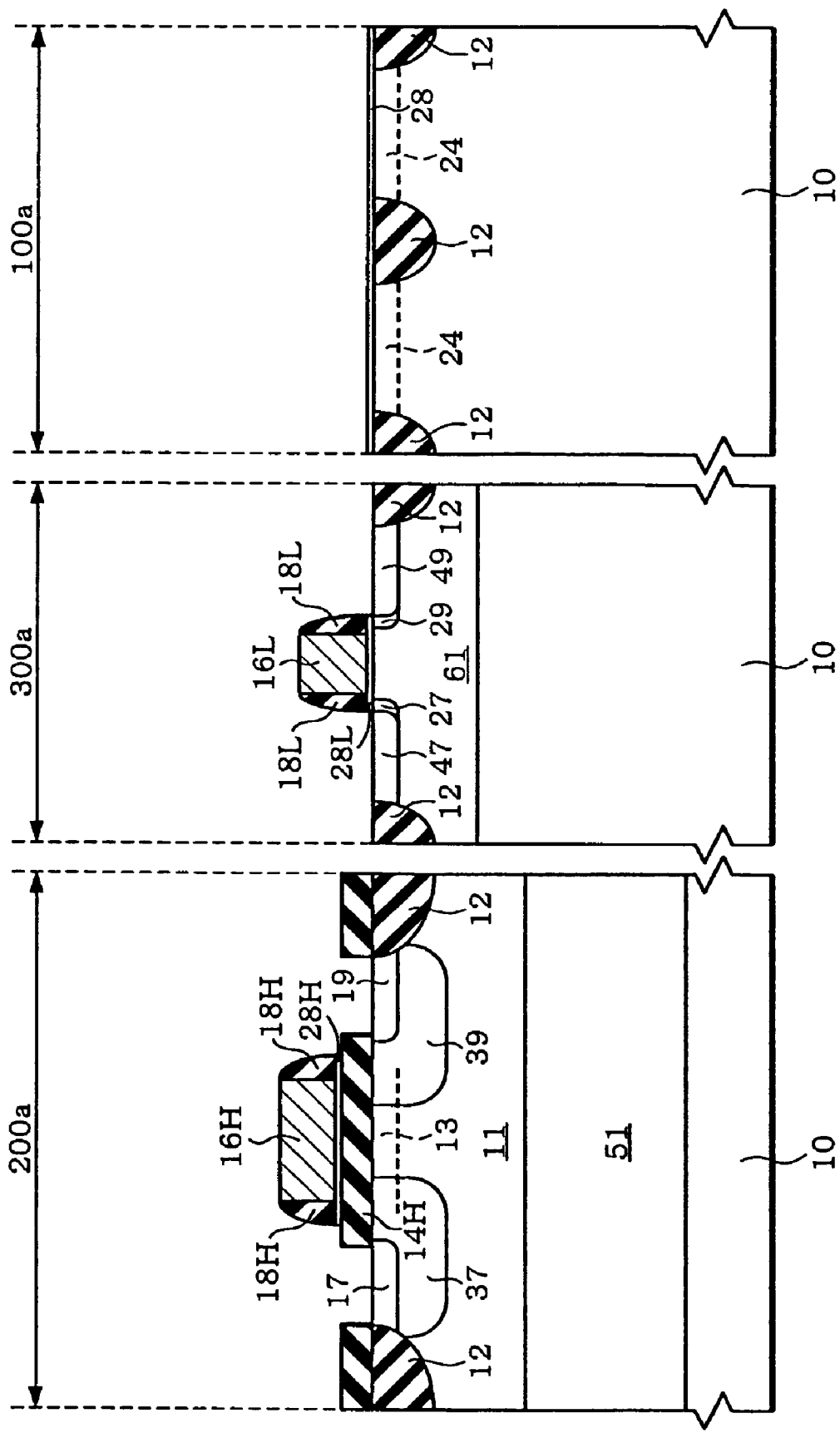
FIG. 23 shows a schematic sectional view illustrating a step of the manufacturing method of the semiconductor device shown in FIGS. 1 and 2.

(L) Next, the source/drain regions 17, 19, 47, 49 of the transistors 200, 300 are formed in the forming region 200a of the heavy insulated transistor and the forming region 300a of the light insulated transistor, and the contact impurity layer 26, continuously connected to the resistive conductive layer 24, is formed in the forming region 100a for the resistive element (refer to FIGS. 20 through 25). FIGS. 20 and 23 show schematic sectional views illustrating a step of forming the source/drain regions 17, 19, 47, 49 of the transistors 200, 300 and the contact impurity layer 26. FIG. 21 shows a plan view illustrating the forming region 100a for the resistive element in the step shown in FIG. 20. That is, a sectional view of the forming region 100a for the resistive element in FIG. 20 shows a schematic sectional view along the line A—A in FIG. 21. FIG. 22 shows a schematic sectional view along the line B—B in FIG. 21.

At first, a resist layer R7 is formed above the semiconductor substrate 10. The resist layer R7 has openings in the forming region 200a for the heavy insulated transistor and the forming region 300a for the light insulated transistor. As shown in FIG. 22, the resist layer R7 has openings, at least, in a region, in which the contact 30 (refer to FIGS. 3 through 5) is formed, in the forming region 100a for the resistive element.

Specifically, as shown in FIGS. 20 through 22, through openings of the resist layer R7, an n-type impurity (second impurity) is doped to the semiconductor substrate 10 by ion implantation. That is, the second impurity is an impurity to be doped for forming the source/drain regions of the transistors 200, 300 and the contact impurity layer 26 of the resistive element 100. In FIG 20, the impurity is doped to portions indicated by "x" in the forming region 200a for the heavy insulated transistor and the forming region 300a for the light insulated transistor 300a. And, in FIG. 22, the impurity is doped to portions indicated by "x" in the forming region 100a for the resistive element. In FIG. 21, a region surrounded by the dotted-line is a region in which the second impurity is doped (second impurity-doping region) 26a, and a region 125, in which the second impurity is not doped (second impurity-doping forbidden region), is shown by cross-hatching.

The second impurity-doping forbidden region 125 is formed, at least, on the element isolation region 12. As for the embodiment, the second impurity-doping forbidden region 125 is formed not only on the element isolation region 12 but also on regions including the active region 15 as shown in FIG. 21. After doping the second impurity, the resist layer R7 is removed.

By retaining the second insulation layer 28 on the semiconductor substrate 10 during the processing of the side walls 18H, 18L (refer to the step (K)), the second insulation layer 28 functions to protect the surface of the semiconductor substrate 10 when the second impurity is doped.

As shown in FIG. 22, the source region 17 and the drain region 19 of the forming region 200a of the heavy insulated transistor are formed in a self-aligned manner by functioning the gate insulation layer 14H as a mask. In addition, as shown in FIG. 23, the source region 47 and the drain region 49 of the forming region 300a for the light insulated transistor are formed in a self-aligned manner by functioning the side wall insulation layer 18L as a mask.

Figure 26:
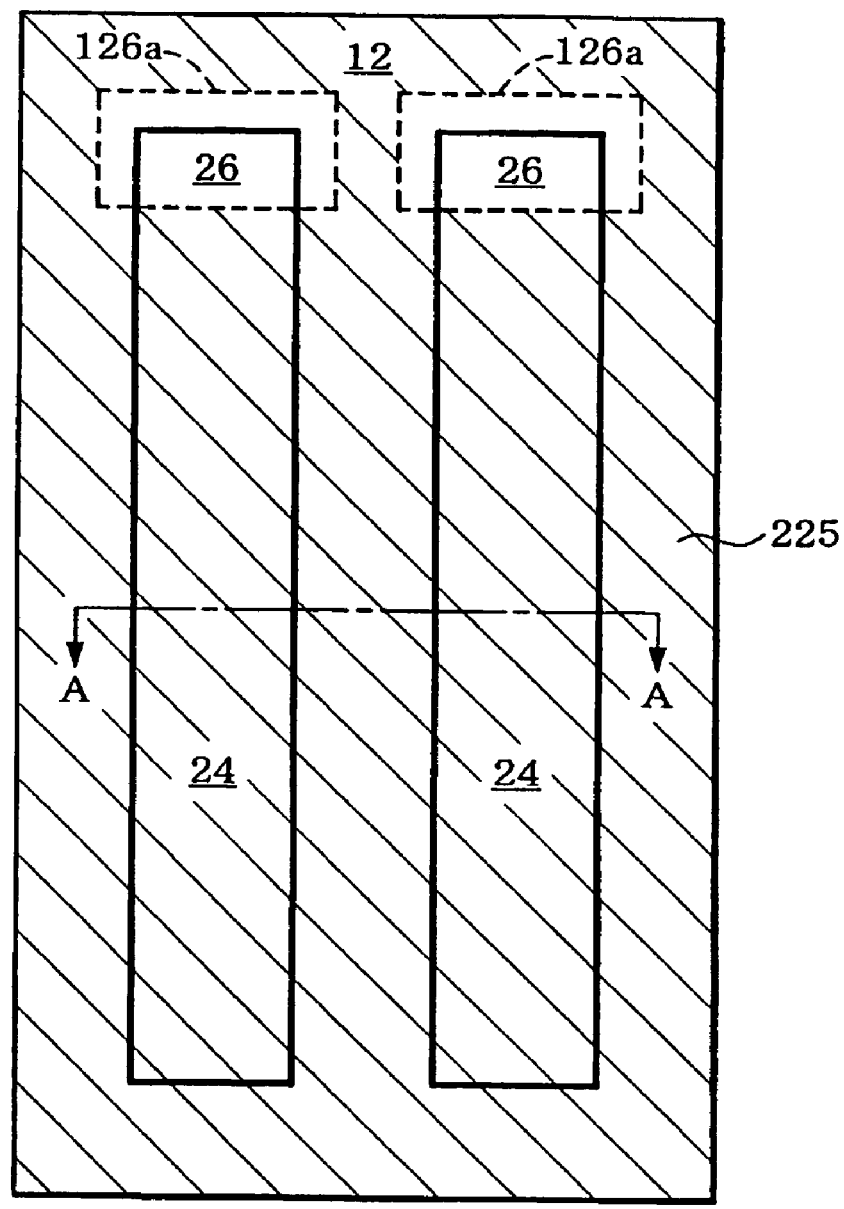
FIG. 26 shows a schematic plan view of a modification of the embodiment.

As for the embodiment, as shown in FIG. 21, a case in which a second impurity-doping region 26a is formed so as to be connected continuously with adjacent resistive impurity layer 24 is shown. However, as shown in FIG. 26, the second impurity can be doped in a manner that isolates adjacent second impurity-doping regions 126a. Accordingly, the second impurity is not doped to the element isolation region 12, thereby a characteristic change of the element isolation region 12 by doping the second impurity can be prevented, and an insulation of the element isolation region 12 can be ensured. FIG. 26 shows a plan view illustrating a modification of the manufacturing method of the semiconductor device of the embodiment. In FIG. 26, the second impurity-doping region 126a is shown by the dotted-line, and a second impurity-doping forbidden region 225 is shown by cross-hatching. As for the modification shown in FIG. 26, the second impurity forbidden region 225 is provided so as to isolate the adjacent second impurity-doping regions 126a. The second impurity forbidden region 225 is formed on the element isolation region 12 and the active region 15, except the second impurity-doping region 126a.

Figure 24:
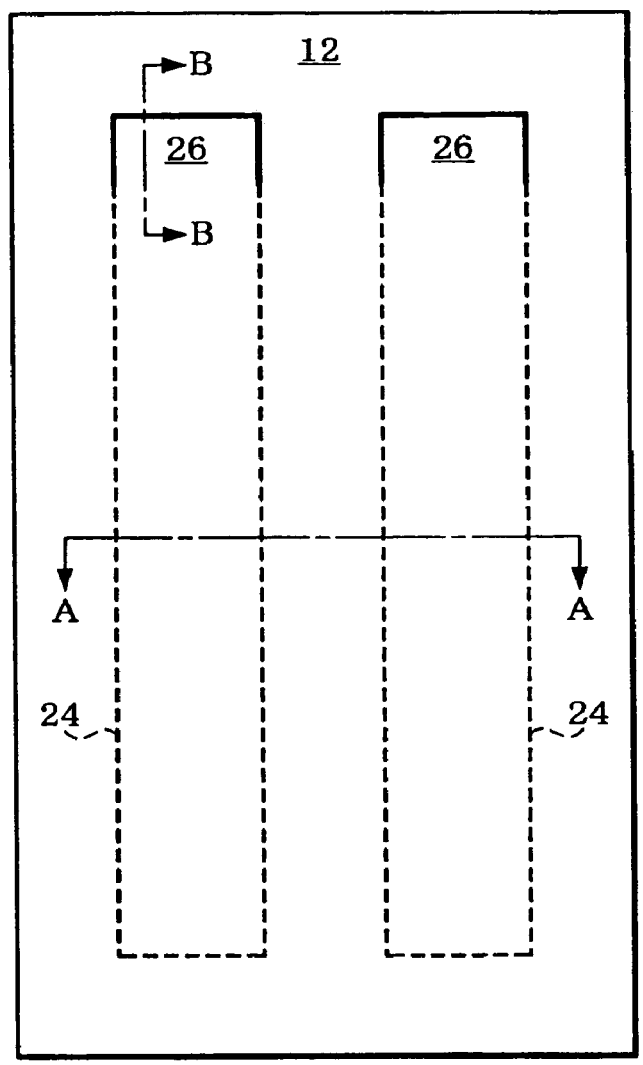
FIG. 24 shows a schematic plan view of the forming region for the resistive impurity layer in the step shown in FIG. 23.
Figure 25:
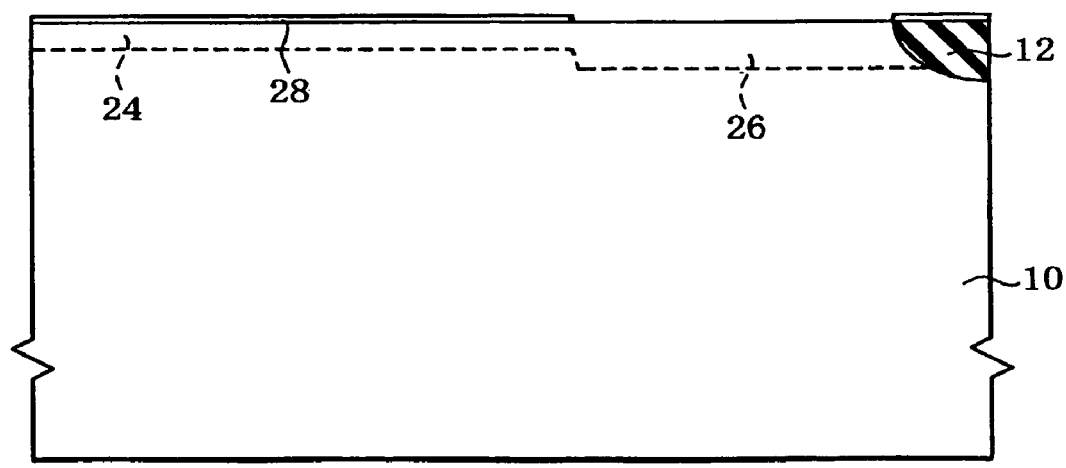
FIG. 25 shows a schematic sectional view of the forming region for the resistive impurity layer along the line B—B in FIG. 24.

Next, by conducting heat treatment to the semiconductor substrate 10, the second impurity, doped in the above-described step, is diffused. As a result, as shown in FIG. 23, the source region 17 and the drain region 19 are formed, respectively, in the offset region 37 and the offset region 39 of the forming region 200a for the heavy insulated transistor, and the source region 27 and the drain region 29 are formed, respectively, in the offset region 47 and the offset region 49 of the forming region 300a for the light insulated transistor. In addition, as shown in FIGS. 24 and 25, the contact impurity layer 26, continuously connected to the resistive impurity layer 24, is formed. The contact impurity layer 26, formed by the above-described step, has a higher concentration of impurity than the resistive impurity layer 24. FIG. 24 shows a plan view illustrating the forming region 100a for the resistive element in the step shown in FIG. 23. That is, a sectional view of the forming region 100a for the resistive element in FIG. 23 shows a schematic sectional view along the line A—A in FIG. 24. FIG. 25 shows a schematic sectional view along the line B—B in FIG. 24.

Next, in the forming region 100a for the resistive element, a resist layer (not shown) is formed on the resistive impurity layer 24. Using the resist layer as a mask, the exposed second insulation layer 28 is removed. As a result, the gate insulation layer 28L of the low resistance transistor 300 is formed. And the second insulation layer 28, formed on the source/drain regions 17, 19, 47, 49, is removed. On one hand, in the forming region 100a for the resistive element, the second insulation layer 28, formed on the contact resistive layer 26, is removed. On one hand, by protecting the resistive impurity layer 24 with the resist layer, the second insulation layer 28 is remained on the resistive impurity layer 24. After that, the resist layer is removed.

(M) Next, in the forming region 200a for the heavy insulated transistor and the forming region 300a for the light insulated transistor, a silicide layer is formed on the source/drain regions and the surface of the gate conductive layer, and in the forming region 100a for the resistive element, a silicide layer is formed on the surface of the contact impurity layer 26 (refer to FIGS. 1 through 5).

Specifically, by a silicide step, silicide layers 17S, 19S, 47S, 49S are formed on each surface of the source/drain regions 17, 19, 47, 49, respectively, the silicide layer 20SH, 20SL are formed on each surface of the gate conductive layers 16H, 16L, respectively, and the silicide layer 26S is formed on the surface of the contact impurity layer 26. Next, to reduce the resistance of the silicide layer, heat treatment is conducted. Next, after forming an insulation layer 70, the contact (not shown) coupled to the source/drain regions 17, 19, 47, 49, and the contact 30 (refer to FIG. 3) coupled to the contact impurity layer 26, are formed. Through the above-described steps, the resistive element 100, the heavy insulated transistor 200 and the light insulated transistor 300 are formed (refer to FIGS. 1 through 5).

According to the semiconductor device and the manufacturing method of the same of the embodiment, following effects can be attained.

(1) Firstly, in the step (E), an insulation of the element isolation region 12 can be ensured by providing the first impurity-doping forbidden region 24 to the element isolation region 12 when the resistive impurity layer 24 is formed by doping the first impurity to the active region 15. To specifically explain this effect, a general manufacturing method of a semiconductor device of a comparison example will be explained hereinafter. FIGS. 28 through 34 show schematic sectional views illustrating a manufacturing step of a general semiconductor device, which is a comparison example. The forming region 100a for the resistive element in FIG. 29 corresponds to a sectional view along the A—A line in FIG. 28. FIGS. 30 through 32 and 34 correspond to a sectional view along the C—C line in FIG. 28.

As for the comparison example shown in FIGS. 28 through 34, manufacturing steps, different from the manufacturing method of the semiconductor device of the embodiment, are mainly explained. That is, the general manufacturing method of the semiconductor device of the comparison example are the same as in the manufacturing method of the semiconductor device of the above-described embodiment until the middle of the steps (the steps (A) through (D))

Figure 29:
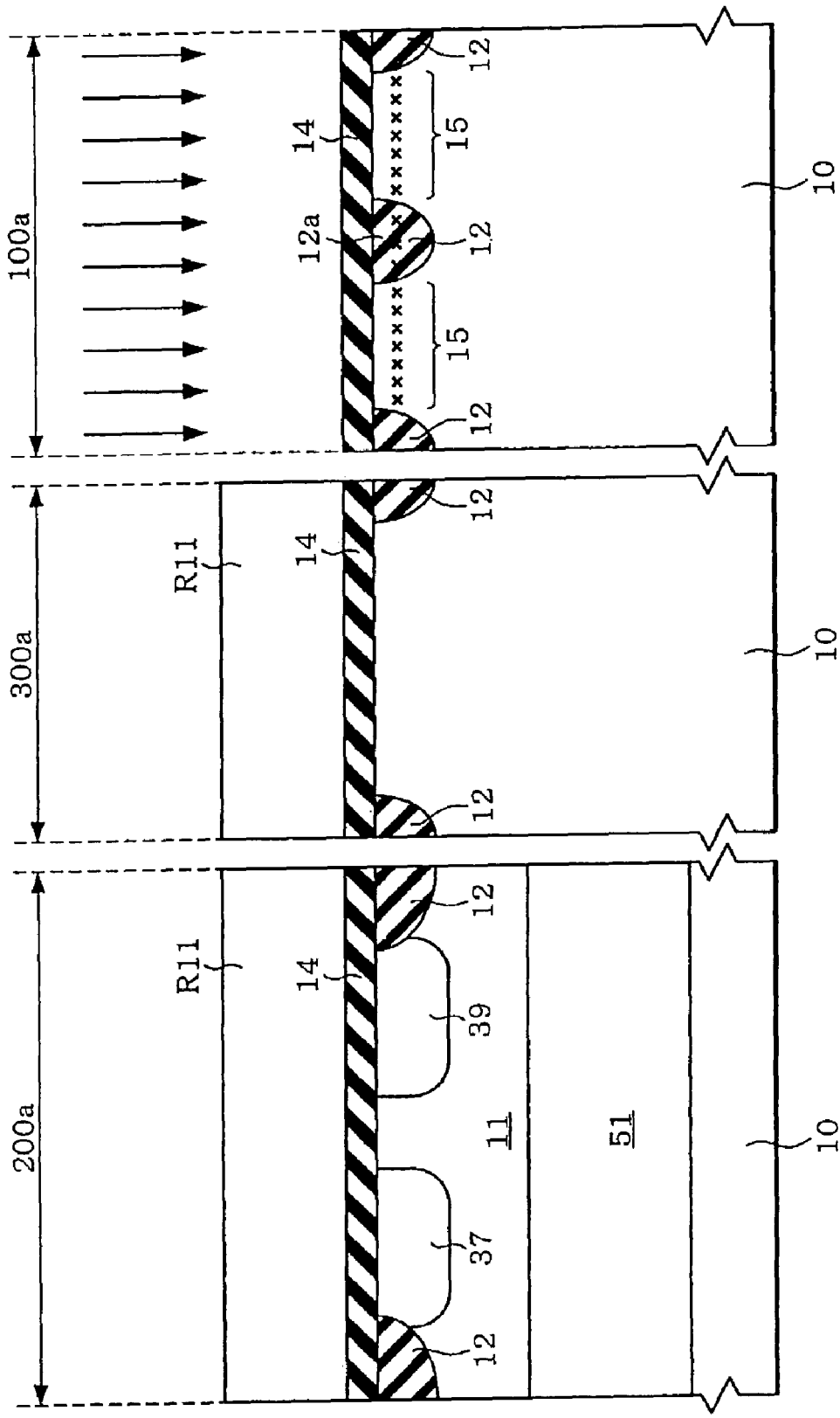
FIG. 29 shows a schematic sectional view illustrating a manufacturing step of the conventional semiconductor device, which is a comparison example.
Figure 30:
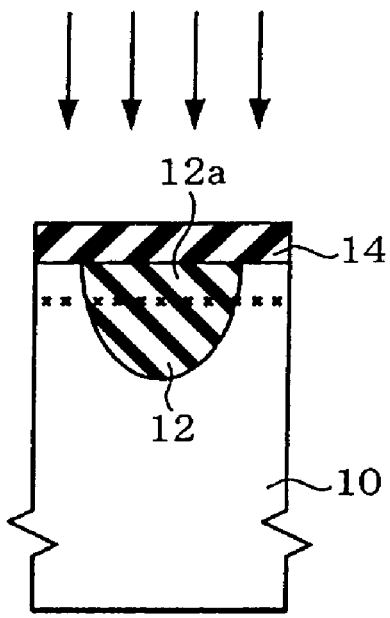
FIG. 30 shows a schematic sectional view illustrating a manufacturing step of the conventional semiconductor device, which is a comparison example.
Figure 31:
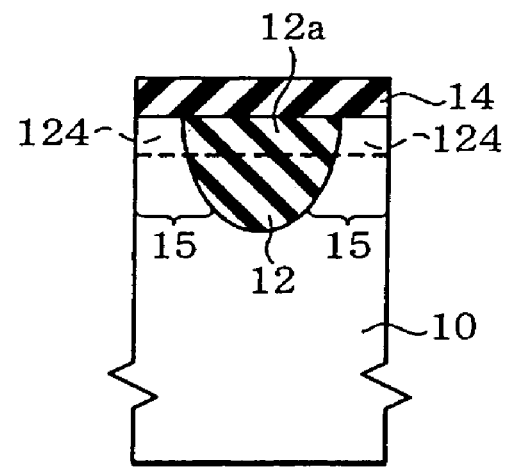
FIG. 31 shows a schematic sectional view illustrating a manufacturing step of the conventional semiconductor device, which is a comparison example.
Figure 32:
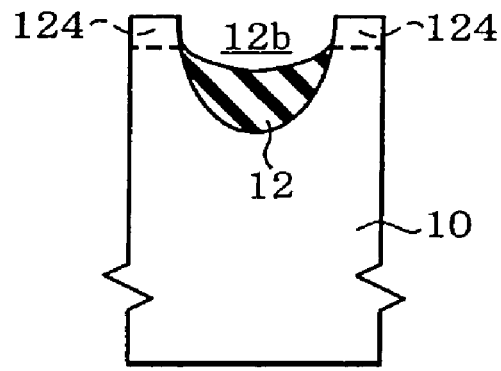
FIG. 32 shows a schematic sectional view illustrating a manufacturing step of the conventional semiconductor device, which is a comparison example.

Next, as for the comparison example, in the step (E), the first impurity is doped to the entire forming region 100a for the resistive element when the impurity (first impurity) for forming the resistive impurity layer 24 is doped to the active region 15 in the forming region 100a for the resistive element (refer to FIGS. 28 through 31). Accordingly, as shown in FIG. 31, the resistive impurity layer 124 is formed in the active region 15, and the first impurity is doped in an upper portion 12a of the element isolation region 12.

Figure 28:
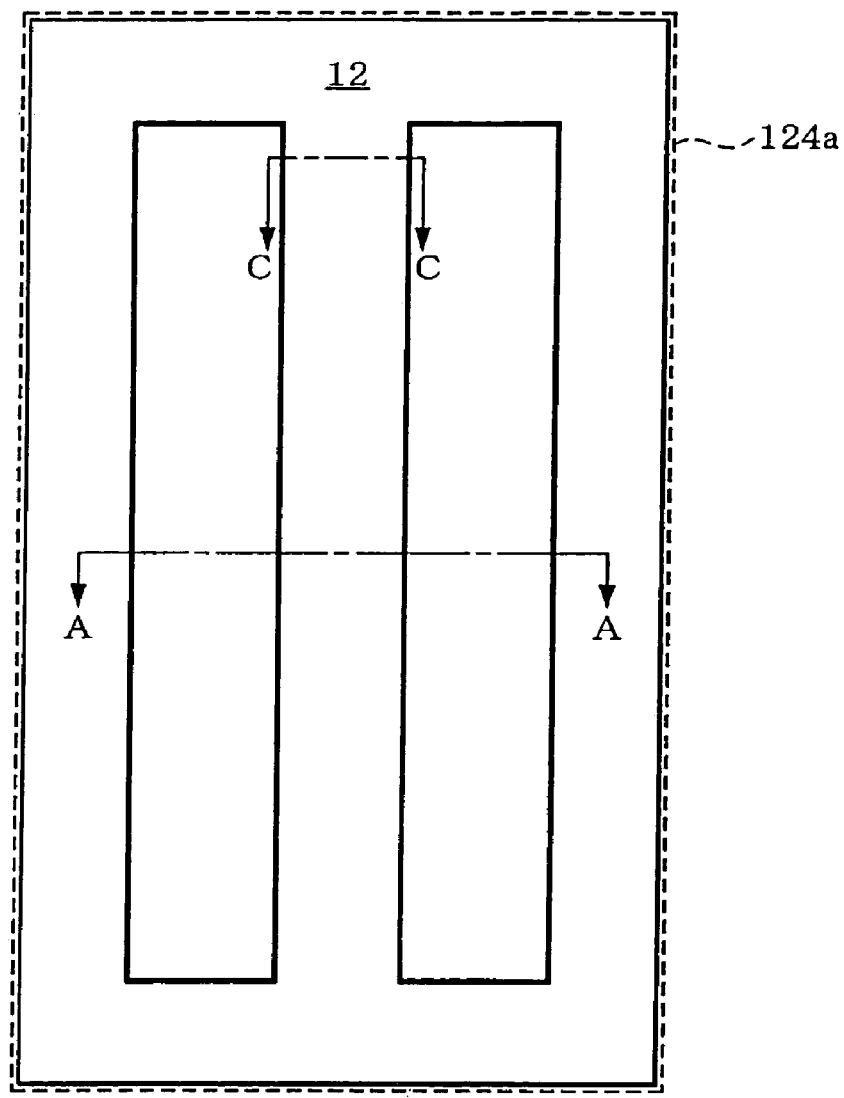
FIG. 28 shows a schematic plan view illustrating a manufacturing step of a conventional semiconductor device, which is a comparison example.

FIG. 28 shows a schematic plan view of the forming region 100a for the resistive element shown in FIG. 29. In FIG. 28, a region surrounded by the dotted-line is the first impurity-doping region (a region in which the first impurity is doped) 124a. Furthermore, in FIGS. 29 and 30, portions indicated by "x" in the forming region 100a for the resistive element are regions, in which the first impurity is doped.

As shown in FIGS. 28 through 30, as for the comparison example, the first impurity is doped to the entire forming region 100a for the resistive element (entire region of the active region 15 and the element isolation region 12). As a result, as shown in FIG. 31, the first impurity is doped to the active region 15, and the first impurity is also doped to the upper portion 12a of the element isolation region 12.

Next, by conducting the same step as in the step (F), the step (G) is conducted. That is, in the step, by etching, the gate insulation layer 14H of the heavy insulated transistor 200 is formed, and the first insulation layer 14 is removed from the forming region 100a for the resistive element and the forming region 300a for the light insulated transistor. In this case, in the steps shown in the above-described FIGS. 28 through 31, the first impurity is doped to the element isolation region 12, and a characteristic of the upper portion 12a of the element isolation region 12 has changed. Accordingly, an etching rate of an etchant used for etching the first insulation layer 14 in a region of the element isolation region 12, in which the first impurity is doped, has changed compared with other region, in which the first impurity is not doped. Accordingly, during the etching, a region 12a, which has a changed etching rate due to doping the first impurity, in the element isolation region 12 is removed, and may have a smaller layer's thickness of the element isolation region 12. In the element isolation region 12 shown in FIG. 32, the region removed by the etching is indicated by 12b.

Figure 33:
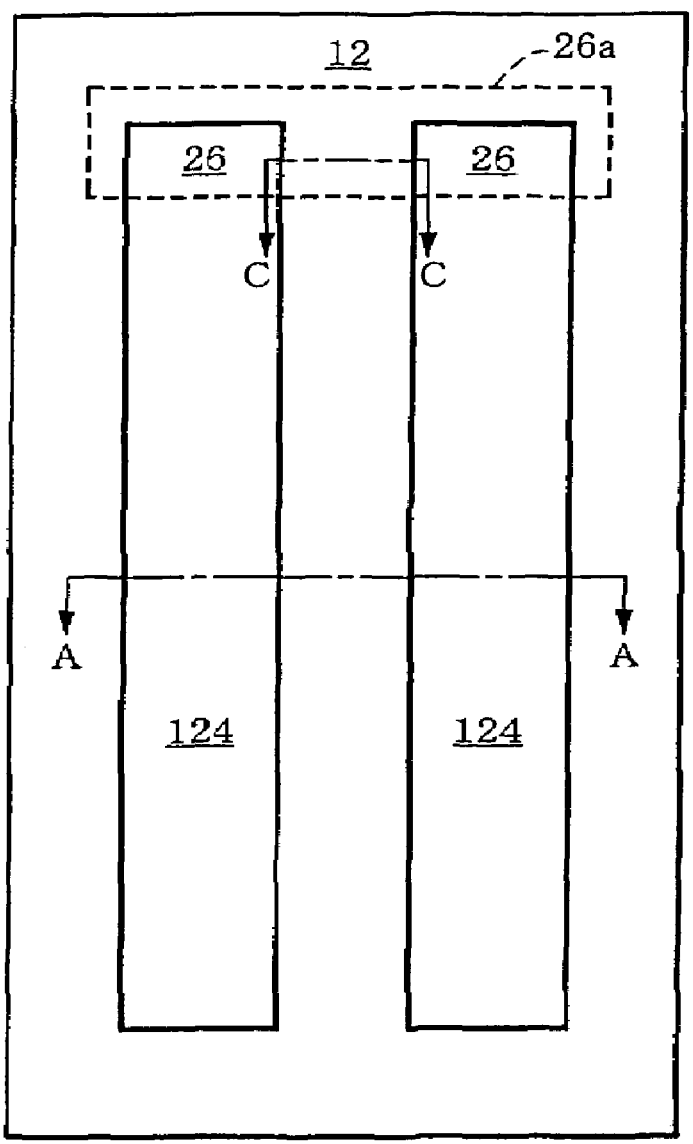
FIG. 33 shows a schematic sectional view illustrating a manufacturing step of the conventional semiconductor device, which is a comparison example.
Figure 34:
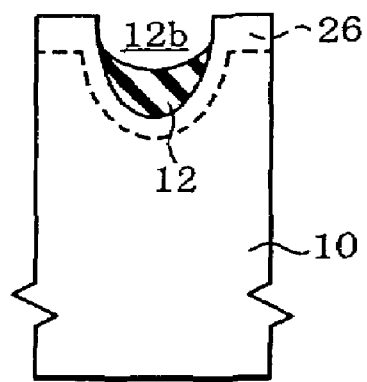
FIG. 34 shows a schematic sectional view illustrating a manufacturing step of the conventional semiconductor device, which is a comparison example.

Next, after conducting the steps (H) through (K), in the step (L), the second impurity for the contact impurity layer 26 is doped in the forming region 100a for the resistive element. As shown in FIG. 33, doping area of the second impurity is the same as in the above-described embodiment. In this case, because the layer's thickness of the element isolation region 12 becomes smaller due to the above-described etching step (refer to FIG. 32), the second impurity is doped to the semiconductor substrate 10 by passing through the element isolation region 12, thereby a problem of electrical conduction of the adjacent contact impurity layers 26 has occurred.

On the contrary, according to the manufacturing method of the semiconductor device of the embodiment, in the step (E), the first impurity-doping forbidden region 25 is provided in the element isolation region 12 when forming the resistive impurity layer 24 by doping the first impurity to the active region 15 in the forming region 100a for the resistive element. Accordingly, the first impurity is not doped to the element isolation region 12, thereby a characteristic change of the element isolation region 12 due to doping the first impurity to the element isolation region 12 can be prevented. And accordingly, in the etching step (G), removal of the element isolation region 12 can be prevented, thereby the insulation of the element isolation region 12 can be ensured, and a high quality semiconductor device can be obtained. Specifically, an insulation of a portion of the element isolation region 12, which isolates the adjacent contact impurity layers 26, can be ensured, and adjacent resistive impurity layers 24 can be insulated securely.

In addition, as for the embodiment, the element isolation region 12 is made from semi-recessed LOCOS. The semi-recessed LOCOS is formed by conducting field oxidation after recessing the semiconductor substrate 10. Therefore, the layer's thickness of the element isolation region 12 made from the semi-recessed LOCOS is smaller than the layer's thickness of an element isolation region made from normal LOCOS oxidation. Accordingly, the manufacturing method of the semiconductor device of the embodiment has a greater effect, which is attained by ensuring the insulation of the element isolation region 12.

Furthermore, as for the manufacturing method of the semiconductor device in the embodiment, in the step (G), by etching, the gate insulation layer 14H of the heavy insulated transistor 200 is formed, and the first insulation layer 14 is removed from the forming region 100a, 300a for the light insulated transistor and for the resistive element. Because the first insulation layer 14 is used for forming the gate insulation layer 14H of the heavy insulated transistor 200, the layer's thickness of the first insulation layer 14 is formed to be thicker to secure heavy insulation. Accordingly, etching condition of the first insulation layer 14 becomes relatively severe. Therefore, like the above-described comparison example, when the first impurity is doped to the element isolation region 12, a portion of the element isolation region 12, in which the first impurity is doped, is likely to be removed when etching the first insulation layer 14.

On the contrary, according to the manufacturing method of the embodiment, the first impurity is not doped, at least, to a region in the element isolation region 12, which isolates the adjacent resistive impurity layers 24, thereby removal of the element isolation region 12 can be prevented when etching the first insulation layer 14. Accordingly, in the step (L), electrical conduction of the adjacent contact impurity layers 26 can be prevented when forming the contact impurity layers 26, continuously connected to the resistive impurity layer 24.

(2) Secondly, a step of forming the source/drain regions of the transistor 200, 300 in the forming regions 200a, 300a of the heavy insulated transistor and the light insulated transistor, and a step of forming the contact impurity layer 26, continuously connected to the resistive conductive layer 24, in the forming region 100a for the resistive element are conducted in a same step, thereby an efficiency of the manufacturing process can be attained.

Figure 27:
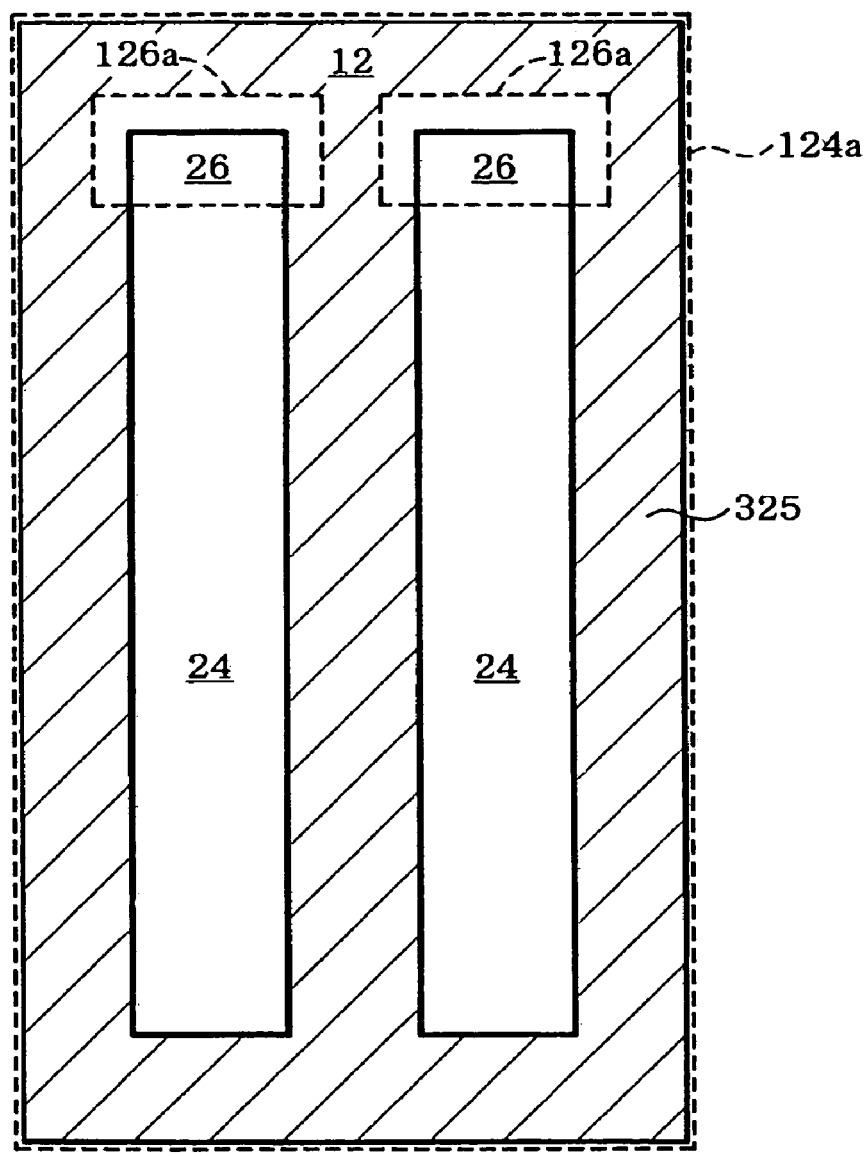
FIG. 27 shows a schematic plan view of another modification of the embodiment.

FIG. 27 shows a plan view of another modification of the manufacturing method of the semiconductor device of the embodiment. The modification includes the same steps as in the manufacturing process of the above-described embodiment of the semiconductor device, except in step (E) the doping area of the first impurity is different from above-described embodiment of the semiconductor device.

In FIG. 27, a first impurity-doping region 124a and a second impurity-doping region 126a are shown by the dotted-line. That is, each region surrounded by the dotted-line is the first impurity-doping region 124a and the second impurity-doping region 126a. And in FIG. 27, a region shown by cross-hatching is a second impurity-doping forbidden region 325.

The first impurity-doping region 124a is a region, in which the first impurity is doped in a step corresponding to the above-described step (E). Specifically, in the step (E) of the manufacturing process of the above-described embodiment, the first impurity is doped to the active region 15. However, in the modification, the first impurity is doped to the active region 15 and the element isolation region 12. In addition, an area to be provided for the second impurity-doping region 126a is the same as in the modification shown in FIG. 26.

In the modification shown in FIG. 27, the second impurity forbidden region 325 is formed so as to isolate the adjacent second impurity-doping regions 126a. Thereby, the second impurity is not doped to a region between the adjacent second impurity-doping regions 126a, and an insulation of the element isolation region 12 can be ensured. Accordingly, electrical conduction of the adjacent contact impurity layers 26 can be prevented.

The present invention is not limited to the above-described embodiments, but various modifications can be employed. For example, the present invention includes constructions, substantially the same as in the constructions of the above-described embodiments (for example, a construction of same function, method and result, or a construction of same purpose and result). The present invention also includes constructions, which replace unessential parts of the constructions of the above-described embodiments. The present invention also includes constructions that can attain the same effect or purpose as in the construction of the above-described embodiments.

For example, in the above-described embodiments, a case that the resistive impurity layer 24 is formed by doping an n-type impurity is shown, but the resistive impurity can be formed also by a p-type impurity.

Also for example, in the above-described embodiments, a case that the transistors 200, 300 are n-type MOS is explained. That is, the semiconductor substrate 10 is a p-type silicone substrate, an impurity doped to the source region 17 and the drain region 19 of the transistor 200 is an n-type impurity, and an impurity doped to the well 11 and the gate conductive layers 16H, 20L of the semiconductor substrate 10 is a p-type impurity. However, replacing them with each other in the each layer does not go beyond the scope of the present invention. For example, instead of the transistors 200, 300, using pMOS transistors 400, 500 shown in FIG. 1 can also perform the same action and effect Furthermore, for example, in the above-described embodiment, a bulk-shaped semiconductor substrate is used for the semiconductor layer, but SOI (Silicon on Insulator) substrate can be used also for the semiconductor layer.

What is claimed is:

1. A manufacturing method of a semiconductor device, in which a resistive impurity layer formed in an active region, and an insulation gate type heavy insulated transistor and an insulation gate type light insulated transistor having different drain-source breakdown voltages, are integrated on a same semiconductor layer, comprising:

(a) forming an element isolation region and an active region, electrically isolated by the element isolation region, on the semiconductor layer;

(b) forming an insulation layer above the semiconductor layer;

(c) forming a resistive impurity layer, at least, in a part of the active region by forming a first impurity-doping region;

(d) forming a gate insulation layer of the heavy insulated transistor in a forming region for the heavy insulated transistor by patterning the insulation layer to a predetermined shape, and removing the insulation layer in forming regions for the light insulated transistor and the resistive impurity layer;

(e) forming a gate insulation layer of the light insulated transistor in the forming region for the light insulated transistor;

(f) forming a gate conductive layer of the each transistor on the first gate insulation layer and the second gate insulation layer; and (g) forming a source/drain region of the each transistor by doping a second impurity, as well as forming a contact impurity layer in a region, continuously connected to the resistive impurity layer, and providing a second impurity-doping forbidden region, at least, in the element isolation region at the same time, while providing a second impurity-doping region, at least in the active region in the forming region for the resistive impurity layer, and a second impurity-doping forbidden region, at least in the element isolation region, wherein a plurality of the contact impurity layers are formed, and the second impurity-doping forbidden region is formed so as to isolate, at least the adjacent second impurity-doping regions, wherein the element isolation region is semi-recessed LOCOS and a thickness of a gate insulation layer of said heavy insulated transistor is thicker than a gate insulation layer of said light insulated transistor.

* * * * *